(12) United States Patent
Tsukuda et al.

(10) Patent No.: US 11,646,376 B2
(45) Date of Patent: May 9, 2023

(54) SEMICONDUCTOR DEVICE AND METHOD OF MANUFACTURING THE SAME

(71) Applicant: RENESAS ELECTRONICS CORPORATION, Tokyo (JP)

(72) Inventors: Eiji Tsukuda, Tokyo (JP); Katsumi Eikyu, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 46 days.

(21) Appl. No.: 17/480,007

(22) Filed: Sep. 20, 2021

(65) Prior Publication Data

US 2023/0090409 A1 Mar. 23, 2023

(51) Int. Cl.
*H01L 29/78* (2006.01)
*H01L 29/66* (2006.01)
*H01L 29/423* (2006.01)

(52) U.S. Cl.
CPC .. *H01L 29/78391* (2014.09); *H01L 29/42328* (2013.01); *H01L 29/6684* (2013.01); *H01L 29/66484* (2013.01); *H01L 29/7831* (2013.01); *H01L 29/6656* (2013.01)

(58) Field of Classification Search
CPC ......... H01L 29/78391; H01L 29/42328; H01L 29/66484; H01L 29/6684; H01L 29/7831; H01L 29/6656
USPC ...................................................... 257/295
See application file for complete search history.

(56) References Cited

U.S. PATENT DOCUMENTS

| | | | |
|---|---|---|---|
| 10,998,408 B2 | 5/2021 | Yamaguchi | |
| 2007/0063238 A1* | 3/2007 | Kaibara | H01L 29/40111 257/295 |
| 2009/0173978 A1* | 7/2009 | Kato | H01L 27/1159 257/E29.264 |
| 2011/0049592 A1* | 3/2011 | Yoon | B82Y 10/00 257/295 |
| 2011/0299318 A1* | 12/2011 | Kaneko | H01L 29/6684 257/295 |
| 2012/0007158 A1* | 1/2012 | Yoon | H01L 29/40111 257/295 |
| 2015/0380511 A1* | 12/2015 | Irsigler | H01L 29/78391 257/295 |

(Continued)

FOREIGN PATENT DOCUMENTS

JP 2019-201172 A 11/2019

*Primary Examiner* — Sheikh Maruf
(74) *Attorney, Agent, or Firm* — McDermott Will & Emery LLP

(57) ABSTRACT

A semiconductor device includes a semiconductor substrate, a first dielectric film, a conductive film, at least one ferroelectric film, a second dielectric film, a memory gate electrode, a third dielectric film and a control gate electrode. The semiconductor substrate includes a source region and a drain region. The semiconductor substrate includes a first region and a second region between the source region and the drain region. The first dielectric film is formed on the first region. The conductive film is formed on the first dielectric film. The at least one ferroelectric film is formed on one hart of the conductive film. The second dielectric film is formed on the other part of the conductive film. The memory gate electrode is formed on the ferroelectric film. The third dielectric film is formed on the second region. The control gate electrode is formed on the third dielectric film.

12 Claims, 31 Drawing Sheets

(56) References Cited

U.S. PATENT DOCUMENTS

| | | | |
|---|---|---|---|
| 2016/0111549 A1* | 4/2016 | Baars | H01L 21/28185 |
| | | | 257/295 |
| 2016/0172396 A1* | 6/2016 | Masuda | H01L 27/14658 |
| | | | 257/295 |
| 2017/0103988 A1* | 4/2017 | Nishida | H01L 29/6684 |
| 2017/0141235 A1* | 5/2017 | Lai | H01L 29/6684 |
| 2019/0115354 A1* | 4/2019 | Tan | H01L 29/42324 |
| 2019/0207009 A1* | 7/2019 | Yamaguchi | H01L 29/6684 |
| 2019/0355584 A1* | 11/2019 | Yamaguchi | H01L 27/11587 |

* cited by examiner

| VOLTAGE [V] \ OPERATION | $V_D$ | $V_{CG}$ | $V_{MG}$ | $V_S$ | $V_W$ |
|---|---|---|---|---|---|
| WRITE | 0 | 0 | $-V_{EC}$ | 0 | 0 |
| ERASE | 0 | 0 | $V_{EC}$ | 0 | 0 |
| READ | $V_{dd1}$ | $V_{dd2}$ | 0 | 0 | 0 |

SEMICONDUCTOR DEVICE AND METHOD OF MANUFACTURING THE SAME

BACKGROUND

The present invention relates to a semiconductor device and a method of manufacturing the same, and relates to a semiconductor device including a ferroelectric film and a method of manufacturing the semiconductor device.

As a memory element operating at a low voltage, ferroelectric memories each including a ferroelectric film have been known. In such a ferroelectric memory, a writing state and an erasing state are determined in accordance with a direction of polarization of the ferroelectric film.

There are disclosed techniques listed below.
[Patent Document 1] Japanese Unexamined Patent Application Publication No. 2019-201172

A semiconductor device described in the Patent Document 1 includes: a semiconductor substrate; a dielectric film formed on the semiconductor substrate; a ferroelectric film formed on the dielectric film; a metal film formed on the ferroelectric film; and a gate electrode formed on the metal film. The ferroelectric film described in the Patent Document 1 is formed by a thermal process to a stacked film including a first amorphous film, a plurality of grains formed on the first amorphous film and a second amorphous film formed on the first amorphous film so as to cover the plurality of grains. In this manner, the plurality of grains become cores, and crystal grain diameters in the ferroelectric film can be uniformed. As a result, variation in a threshold voltage of the semiconductor device can be reduced.

SUMMARY

At a time of a reading operation, a voltage having a magnitude between a threshold voltage of the writing state and a threshold voltage of the erasing state is applied to the gate electrode of the semiconductor device. In other words, at the time of the reading operation, a bias may be applied to the gate electrode. In this manner, at the time of the reading operation, a polarization state of the ferroelectric film may change. Therefore, conventional semiconductor devices have a room for improvement in order to increase reliability.

An object of an embodiment is to increase the reliability of the semiconductor device. Other objects and novel characteristics will be apparent from the description of the present specification and the accompanying drawings.

A semiconductor device according to the embodiment includes: a semiconductor substrate including a source region and a drain region formed on its main surface, a first region between the source region and the drain region to be closer to the source region, and a second region therebetween to be closer to the drain region; a first dielectric film formed on the first region of the semiconductor substrate; a conductive film formed on the first dielectric film; at least one ferroelectric film formed on one part of the conductive film; a second dielectric film formed on the other part of the conductive film; a memory gate electrode formed on the ferroelectric film; a third dielectric film formed on the second region of the semiconductor substrate; and a control gate electrode formed on the third dielectric film.

A method of manufacturing a semiconductor device according to the embodiment includes: a step of forming a first dielectric film on a main surface of a semiconductor substrate; a step of forming a first conductive film on the first dielectric film; a step of forming a ferroelectric film on the first conductive film; a step of forming a second conductive film for a memory gate electrode on the ferroelectric film; a step of patterning the second conductive film to form the memory gate electrode and patterning the ferroelectric film, the first conductive film and the first dielectric film; a step of forming a sidewall dielectric film on a sidewall of a structural body made of the memory gate electrode, the ferroelectric film, the first conductive film and the first dielectric film; a step of forming a second dielectric film on the main surface of the semiconductor substrate; a step of forming a control gate electrode on the second dielectric film so as to be adjacent to the memory gate electrode via the sidewall dielectric film; and a step of forming a source region in a region adjacent to the memory gate electrode and forming a drain region in a region adjacent to the control gate electrode in the semiconductor substrate in a plan view.

In the semiconductor device according to the embodiment, the reliability of the semiconductor device can be improved.

BRIEF DESCRIPTIONS OF THE DRAWINGS

DETAILED DESCRIPTION

Figure 1:
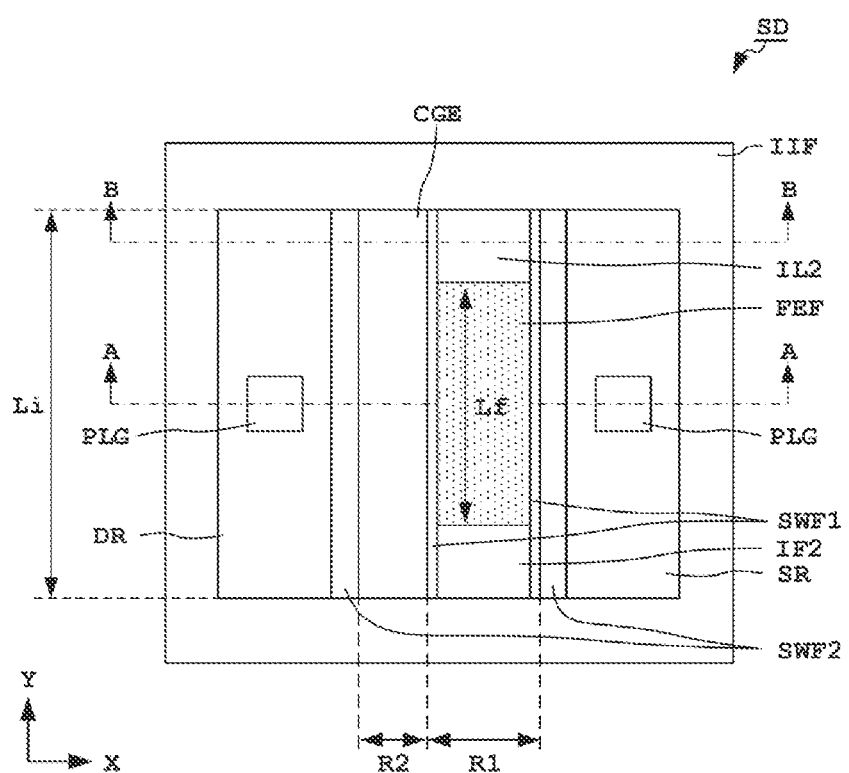
FIG. 1 is a plan view showing one example of a configuration of a principal part of a semiconductor device according to one embodiment.

A semiconductor device according to one embodiment will be described in detail below with reference to the accompanying drawings. Note that the same reference symbols or hatchings are attached to the same elements or corresponding elements in the specification and the drawings, and the repetitive description thereof will be omitted. In addition, in the drawings, configurations are omitted or simplified in some cases as a matter of convenience for the explanation. Further, the cross-sectional views are illustrated as end views in some cases so as to make the drawings easy to see. Further, hatchings are added even in the plan views in some cases.

[Configuration of Semiconductor Device]

Figure 2:
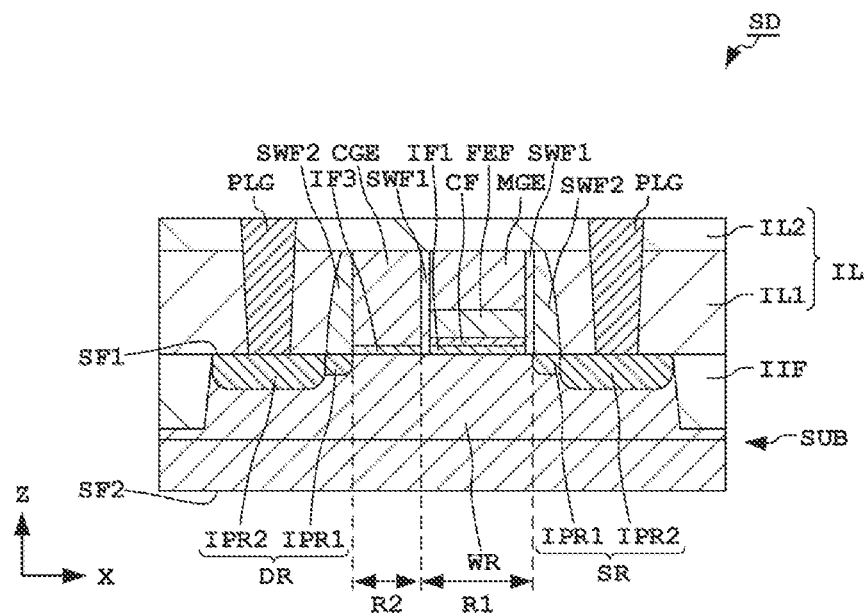
FIG. 2 is a cross-sectional view showing one example of a configuration of a principal part of the semiconductor device according to one embodiment.
Figure 3:
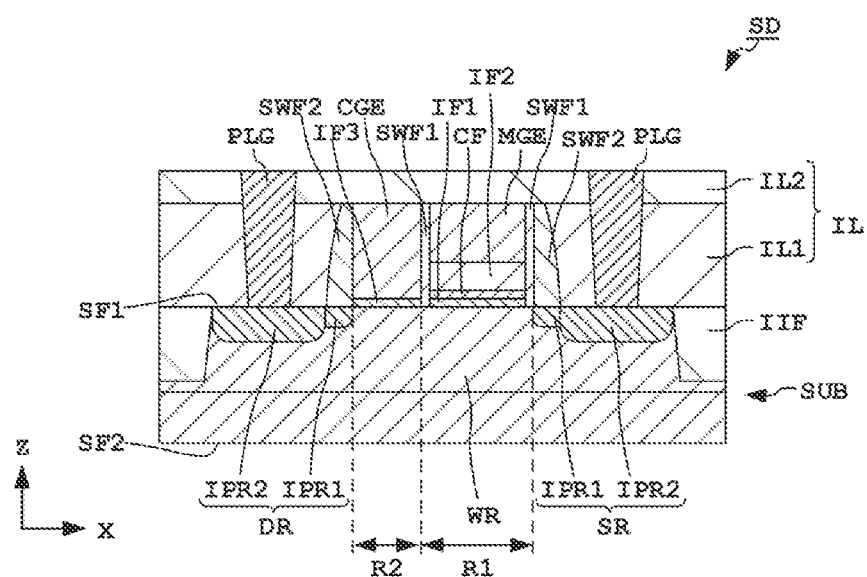
FIG. 3 is a cross-sectional view showing one example of a configuration of a principal part of the semiconductor device according to one embodiment.

FIG. 1 is a plan view showing one example of a configuration of a principal part of a semiconductor device SD according to the present embodiment. FIG. 2 is a cross-sectional view showing one example of a configuration of a principal part of the semiconductor device SD. FIG. 2 is a cross-sectional view taken along a line A-A of FIG. 1. FIG. 3 is a cross-sectional view showing one example of a configuration of a principal part of the semiconductor device SD. FIG. 3 is a cross-sectional view taken along a line B-B of FIG. 1.

The semiconductor device SD includes a semiconductor substrate SUB, an isolation dielectric film IIF, a first dielectric film IF1, a conductive film CF, a ferroelectric film FEF, a second dielectric film IF2, a memory gate electrode MGE, a pair of first sidewall dielectric films SWF1, a third dielectric film IF3, a control gate electrode CGE, a pair of second sidewall dielectric films SWF2, a dielectric layer IL and a plug PLG. In FIG. 1, the memory gate electrode MGE and the dielectric layer IL are omitted so as to make the drawings easy to see.

As shown in FIGS. 1 to 3, an X direction, a Y direction and a Z direction are described as follows. The X direction is a direction heading from either one of a source region SR and a drain region DR to the other. In the present embodiment, the X direction is a direction heading from the source region SR to the drain region DR. The X direction extends along a main surface (first surface SF1) of the semiconductor substrate SUB. The Y direction is a direction orthogonal to the X direction in a plan view. The Y direction extends along a longitudinal side of the ferroelectric film FEF. The Y direction extends along the first surface SF1 of the semiconductor substrate SUB. The Z direction is a thickness direction of the ferroelectric film FEF. The X direction, the Y direction and the Z direction are orthogonal to one another.

The semiconductor substrate SUB includes the first surface (main surface) SF1 and a second surface SF2 opposite to the first surface SF1. A semiconductor element such as a transistor, a register and a capacitor may be formed on the first surface SF1 of the semiconductor substrate SUB. In the present embodiment, the ferroelectric memory cell is formed on the first surface SF1 of the semiconductor substrate SUB. A type of the semiconductor substrate SUB is, for example, a silicon single crystal substrate. A specific resistance of the semiconductor substrate SUB is, for example, equal to or higher than 1 Ω·cm and equal to or lower than 10 Ω·cm.

The semiconductor substrate SUB includes a first region R1 and a second region R2. The first region R1 is formed between the source region SR and the drain region DR to be closer to the drain region DR. The second region R2 is formed between the source region SR and the drain region DR to be closer to the source region SR. The first region R1 and the second region R2 are adjacent to each other.

A well region WR, the source region SR, the drain region DR and the isolation dielectric film IIF are formed on the first main surface SF1 of the semiconductor substrate SUB.

The well region WR, the source region SR and the drain region DR configure a part of the ferroelectric memory cell.

The well region WR is directly in contact with the source region SR and the drain region DR. Inside the first main surface SF1, the well region WR is formed between the source region SR and the drain region DR. In a plan view, a part of the well region WR overlaps the source region SR and the drain region DR. The well region WR contains an impurity of a predetermined concentration. The well region WR has a first conductivity type. The first conductivity type is, for example, a p-type.

The source region SR and the drain region DR separate from each other. The source region SR is formed in a region adjacent to the memory gate electrode MGE in the semiconductor substrate SUB in a plan view. The drain region DR is formed in a region adjacent to the control gate electrode CGE in the semiconductor substrate SUB in a plan view. Each of the source region SR and the drain region DR contains an impurity of a predetermined concentration. Each of the source region SR and the drain region DR has a second conductivity type that is different from the first conductivity type. The second conductivity type is, for example, an n-type.

In order to reduce a contact resistance with the plug, a silicide layer may be formed on each upper surface of the source region SR and the drain region DR. As a material of the silicide layer, for example, cobalt silicide, nickel silicide, platinum silicide or nickel platinum silicide is exemplified.

Each of the source region SR and the drain region DR includes a first impurity region IPR1 and a second impurity region IPR2. An impurity concentration, a conductivity type and a depth of the first impurity region IPR1 configuring the source region SR may be the same as or different from an impurity concentration, a conductivity type and a depth of the first impurity region IPR1 configuring the drain region DR. An impurity concentration, a conductivity type and a depth of the second impurity region IPR2 configuring the source region SR may be the same as or different from an impurity concentration, a conductivity type and a depth of the second impurity region IPR2 configuring the drain region DR. The first impurity region IPR1 is formed directly below the second sidewall dielectric film SWF2. The first impurity region IPR1 is a region including so-called extension region and halo region. The extension region is formed in the main surface SF1 of the semiconductor substrate SUB. The halo region is formed directly below the extension region. An impurity concentration of the extension region of the first impurity region IPR1 is smaller than an impurity concentration of the second impurity region IPR2. The second impurity region IPR2 is positioned to be closer to the isolation dielectric film IIF than the second sidewall dielectric film SWF2 in a plan view.

The isolation dielectric film IIF surrounds a region that functions as the ferroelectric memory cell in a plan view. The isolation dielectric film IIF surrounds the source region SR, the drain region DR, a region sandwiched by the source region SR and the drain region DR, the first region R1 and the second region R2. The isolation dielectric film IIF is formed in the first surface SF1 of the semiconductor substrate SUB. As a material of the isolation dielectric film IIF, for example, silicon oxide is exemplified.

At the time of operation of the semiconductor device SD, the first dielectric film IF1 suppresses unexpected electrons from entering the ferroelectric film FEF from the semiconductor substrate SUB. The first dielectric film IF1 is formed on the first surface SF1 of the semiconductor substrate SUB. The first dielectric film IF1 is formed on the first region R1 of the semiconductor substrate SUB. A part of the first dielectric film IF1 may be formed on the isolation dielectric film IIF.

The first dielectric film IF1 may be a single layer film or a stacked film. In the present embodiment, the first dielectric film IF1 is a single layer film made of a silicon oxide film. The first dielectric film IF1 may be a stacked film including a silicon oxide film and a hafnium oxide film. The hafnium oxide film is formed on the silicon oxide film. A thickness of the first dielectric film IF1 is, for example, equal to or larger than 1 nm and equal to or smaller than 3 nm.

The first conductive film CF1 is formed on the first dielectric film IF1. In the first conductive film CF1, a portion of the semiconductor substrate SUB, the portion overlapping the first conductive film CF1 in a plan view, functions as a channel. A part of the first conductive film CF1 is exposed from the ferroelectric film FEF. In this manner, a portion of the semiconductor substrate SUB, the portion exposed from the ferroelectric film FEF and positioned directly below the first conductive film CF1, can also function as the channel.

The ferroelectric film FEF is formed on the first conductive film CF1. The ferroelectric film FEF may be formed on the entire first conductive film CF1 or a part of the first conductive film CF1. In the first embodiment, the ferroelectric film FEF is formed on a part of the first conductive film CF1. Although described in detail later, in order to effectively apply an electric field to the ferroelectric film FEF, the ferroelectric film FEF is preferably formed on a part of the first conductive film CF1.

The ferroelectric film FEF preferably has a portion shorter than a length Li of the first dielectric film IF1 in the Y direction. In the present embodiment, the entire length Lf of the ferroelectric film FEF is smaller than the length Li of the first dielectric film IF1 in the Y direction. The semiconductor device SD includes the memory gate electrode MGE and the control gate electrode CGE that are formed between the source region SR and the drain region DR in a plan view. Since the two gate electrodes are formed as described above, formation of the length of the ferroelectric film FEF to be smaller than the length of the first dielectric film IF1 in the X direction is limited because of reasons in manufacturing. In other words, in a viewpoint of scaling, the length Lf of the ferroelectric film FEF is preferably smaller than the length Li of the first dielectric film IF1 in the Y direction. Although described in detail later, this manner can increase the hysteresis characteristics of the ferroelectric film FEF.

The number and the position of the ferroelectric films FEF are not particularly limited. The number of the ferroelectric films FEF may be one or plural. In the present embodiment, the number of the ferroelectric films FEF is one. The ferroelectric film FEF is positioned between the source region SR and the drain region DR in a plan view. The ferroelectric film FEF may be in contact with the isolation dielectric film IIF or separate from the isolation dielectric film IIF in a plan view. In the present embodiment, the ferroelectric film FEF separates from the isolation dielectric film IIF in a plan view. The ferroelectric film FEF is formed at a center of a region surrounded by the isolation dielectric film IIF in the Y direction. In this manner, a fringe electric field that is generated between the conductive film CF and a side surface of the memory gate electrode MGE can also contribute to the polarization of the ferroelectric film FEF. As a result, the ferroelectric film FEF can be further effectively polarized.

A thickness of the ferroelectric film FEF is, for example, equal to or larger than 6 nm and equal to or smaller than 20 nm. The ferroelectric film FEF may be a single layer film or a stacked film. In the present embodiment, the ferroelectric film FEF is the single layer film.

A material of the ferroelectric film FEF is a ferroelectric substance. Dielectric polarization is generated by application of an electric field to the ferroelectric substance, and a polarization state is maintained even after stop of the application of the electric field. A crystal structure of the ferroelectric film FEF is mainly an orthorhombic crystal system. In this manner, the characteristics of the ferroelectric substance are obtained. If the crystal structure of the ferroelectric film FEF is not the orthorhombic crystal system, characteristics of a paramagnetic substance appear, and desirable characteristics functioning as the ferroelectric memory cannot be obtained. A material of the ferroelectric film FEF has a higher dielectric constant than a dielectric constant of, for example, silicon nitride. The material of the ferroelectric film FEF contains, for example, hafnium (Hf) and oxygen (O). In other words, the ferroelectric film FEF is a hafnium oxide film. The ferroelectric film FEF may further contain zirconium (Zr), silicon (Si), germanium (Ge), yttrium (Y), lanthanum (La) or ytterbium (Yb).

The ferroelectric film FEF preferably further contains a crystallization accelerator. The crystallization accelerator functions as a core in a crystallization step (a step of forming the ferroelectric film FEF), and accelerates crystallization of the ferroelectric film FEF. The crystallization accelerator is, for example, aluminum (Al), carbon (C) or fluorine (F). The crystallization accelerator may be entirely evenly or partially contained in the ferroelectric film FEF. If the crystallization accelerator is partially contained in the ferroelectric film FEF, the crystallization accelerator is preferably dispersed to a portion near a center of the ferroelectric film FEF in a thickness direction of the ferroelectric film FEF. In this manner, the crystallization in the ferroelectric film FEF is entirely evenly accelerated.

The second dielectric film IF2 is formed on the other part of the conductive film CF. The second dielectric film IF2 is formed on a portion of the conductive film CF, the portion being exposed from the ferroelectric film FEF. The second dielectric film IF2 functions as a spacer between the conductive film CF and the memory gate electrode MGE. A material of the second dielectric film IF2 is, for example, silicon oxide. A thickness of the second dielectric film IF2 is preferably substantially equal to the thickness of the ferroelectric film FEF.

The memory gate electrode MGE may be formed on the ferroelectric film FEF so as not to overlap the second dielectric film IF2 in a plan view or formed on the ferroelectric film FEF and the second dielectric film IF2. In the present embodiment, the memory gate electrode MGE is formed on the ferroelectric film FEF and the second dielectric film IF2. The memory gate electrode MGE has a conductivity. A material of the memory gate electrode MGE is, for example, polycrystal silicon or aluminum. Alternatively, the memory gate electrode MGE may be a stacked film made of a titanium nitride film and a polycrystal silicon film or an aluminum film formed on the titanium nitride film. The titanium nitride film is directly in contact with the ferroelectric film FEF. The titanium nitride film accelerates the crystallization of the ferroelectric film FEF. In this manner, the characteristics of the semiconductor device SD can be further enhanced.

A pair of first sidewall dielectric films SWF1 are formed on the first surface SF1 of the semiconductor substrate SUB so as to sandwich a first structural body made of the first dielectric film IF1, the conductive film CF, the ferroelectric film FEF, the second dielectric film IF2 and the memory gate electrode MGE in the X direction. A thickness of the first sidewall dielectric film SWF1 is not particularly limited if the breakdown voltage between the memory gate electrode MGE and the control gate electrode CGE can be secured by the first sidewall dielectric films SWF1. The thickness of the first sidewall dielectric film SWF1 is, for example, equal to or larger than 10 nm and equal to or smaller than 20 nm. The first sidewall dielectric film SWF1 may be a single layer film or a stacked film. In the present embodiment, a material of the first sidewall dielectric film SWF1 is silicon oxide, silicon nitride or silicon oxynitride.

The third dielectric film IF3 is formed on the first surface SF1 of the semiconductor substrate SUB. The third dielectric film IF3 is formed on the second region R2 of the semiconductor substrate SUB. A part of the third dielectric film IF3 may be formed on the isolation dielectric film IIF. A material of the third dielectric film IF3 is, for example, silicon oxide. A thickness of the third dielectric film IF3 may be the same as or different from the thickness of the first dielectric film IF1. The thickness of the third dielectric film IF3 is, for example, equal to or larger than 2 nm and equal to or smaller than 3 nm.

The control gate electrode CGE is formed on the third dielectric film IF3. The control gate electrode CGE has a conductivity. A material of the control gate electrode CGE is, for example, polycrystal silicon or aluminum. Alternatively, the control gate electrode CGE may be a stacked film made of a titanium nitride film and a polycrystal silicon film or an aluminum film formed on the titanium nitride film.

A pair of second sidewall dielectric films SWF2 are formed on the first surface SF1 of the semiconductor substrate SUB so as to sandwich the first structural body and a second structural body made of the first sidewall dielectric film SWF1, the third dielectric film IF3 and the control gate electrode CGE. The second sidewall dielectric film SWF2 may be a single layer film or a stacked film. A material of the second sidewall dielectric film SWF2 is silicon oxide or silicon nitride.

The dielectric layer IL is formed on the first surface SF1 of the semiconductor substrate SUB so as to cover a gate structural body made of the second structural body and the second sidewall dielectric film SWF2. The dielectric layer IL includes a first dielectric layer IL1 and a second dielectric layer IL2.

The first dielectric layer IL1 is formed on the first surface SF1 of the semiconductor substrate SUB in a region except for a region surrounded by the pair of second sidewall dielectric films SWF2 in a plan view. In the present embodiment, a thickness of the first dielectric layer IL1 is substantially equal to a height of the gate structural body. A material of the first dielectric layer IL1 is, for example, silicon oxide.

The second dielectric layer IL2 is formed on the first dielectric layer IL1 and the gate structural body. A material of the second dielectric layer IL2 is, for example, silicon oxide.

The plug PLG is formed inside the dielectric layer IL so as to reach the source region SR or the drain region DR. A material of the plug PLG is, for example, tungsten.

Although not particularly illustrated, a wiring connected to the plug PLG is formed on the dielectric layer IL. Other plugs are formed on the dielectric layer IL so as to reach each of the well region WR, the memory gate electrode MGE and the control gate electrode CGE. In this manner, a potential can be supplied to each of the well region WR, the memory gate electrode MGE and the control gate electrode CGE.

[Operations of Semiconductor Device SD]

Next, operations of the semiconductor device SD will be explained. In this section, operations of one ferroelectric memory cell configuring the semiconductor device SD will be explained. Each of the writing operation, the erasing operation and the reading operation will be explained below.

Figures 4, 5:
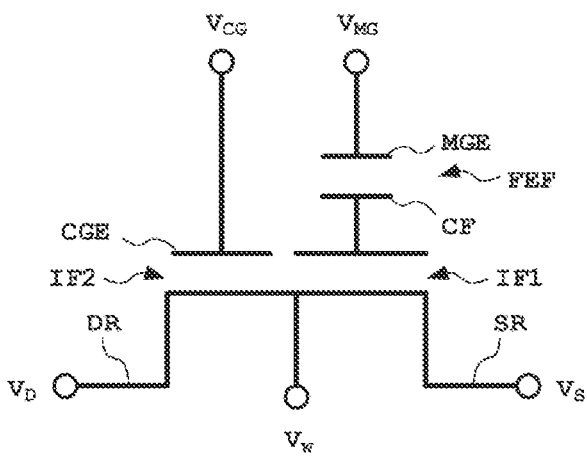
FIG. 4 is a circuit diagram showing an equivalent circuit of a principal part of the semiconductor device according to one embodiment.
FIG. 5 is a table showing one example of a voltage applied to each component of the semiconductor device according to one embodiment in each of a wiring operation, an erasing operation and a reading operation.

FIG. 4 is a circuit diagram showing an equivalent circuit of a principal part of the semiconductor device SD. FIG. 5 is a table showing one example of a voltage applied to each component of the semiconductor device SD in each of the writing operation, the erasing operation and the reading operation. In FIGS. 4 and 5, a term $V_S$ indicates a voltage applied to the source region SR. A term $V_D$ indicates a voltage applied to the drain region DR. A term $V_W$ indicates a voltage applied to the well region WR. A term $V_{MG}$ indicates a voltage applied to the memory gate electrode MGE. A term $V_{CG}$ indicates a voltage applied to the control gate electrode CGE.

A case of the polarization state of the ferroelectric film FEF to be a first (upward) polarization state is referred to as a "writing state". A case of the polarization state of the ferroelectric film FEF to be a second (downward) polarization state that is different from the first polarization state is referred to as an "erasing state". In the erasing state, a threshold voltage for use in bringing a region (first region R1) directly below the memory gate electrode MGE to be in a low resistance state is lower than that of the writing state.

(Writing Operation)

A negative voltage $-V_{EC}$ is applied to the memory gate electrode MGE, so that bias is applied to the memory gate electrode MGE. In this manner, the polarization state of the ferroelectric film FEF becomes the first polarization state. In other words, the state of the ferroelectric memory cell is the writing state. At this stage, the same magnitude voltage is applied to the source region SR, the drain region DR, the well region WR and the control gate electrode CGE. The voltage $V_{EC}$ is, for example, 3 V. The voltage applied to each of the source region SR and the drain region DR is, for example, 0 V.

(Erasing Operation)

A positive voltage $V_{EC}$ is applied to the memory gate electrode MGE, so that bias that is reverse to that of the writing operation is applied to the memory gate electrode MGE. In this manner, the polarization state of the ferroelectric film FEF becomes the second polarization state. In other words, the state of the ferroelectric memory cell is the erasing state. At this stage, the same magnitude voltage is applied to the source region SR, the drain region DR, the well region WR and the control gate electrode CGE. The voltage applied to each of the source region SR, the drain region DR, the well region WR and the control gate electrode CGE is, for example, 0 V.

(Reading Operation)

Bias is applied between the source region SR and the drain region DR while the voltage having a predetermined magnitude is applied to the control gate electrode CGE. For example, a voltage of 0 V is applied to the source region SR, and a voltage $V_{dd1}$ is applied to the drain region DR. At this stage, a voltage $V_{dd2}$ is applied to the control gate electrode CGE. The voltage $V_{dd2}$ is smaller than the voltage $V_{dd1}$. For example, the voltage $V_{dd1}$ is 1.5 V, and the voltage $V_{dd2}$ is 1.3 V. In a viewpoint of prevention of change of the polarization state of the ferroelectric film FEF, the voltage applied to the memory gate electrode MGE and the well region WR is 0 V. The voltage $V_{dd2}$ is set to be larger than a threshold voltage for use in bringing a region (second region R2) directly below the control gate electrode CGE to be in a low resistance state. As a result, an electric current value flowing in the ferroelectric memory cell in the erasing state is larger than an electric current value flowing in the ferroelectric memory cell in the writing state. In this manner, the state of the ferroelectric memory cell is read on the basis of the magnitude of the electric current value flowing in the ferroelectric memory cell.

[Features of Embodiment]

In this section, main features of the semiconductor device SD according to the present embodiment will be explained.

(First Feature)

The semiconductor device SD is controlled by two gate electrodes that are the control gate electrode CGE and the memory gate electrode MGE. Therefore, if the threshold voltage in the writing state is larger than 0 V while the threshold voltage in the erasing state is smaller than 0 V in the region directly below the memory gate electrode MGE, it is unnecessary to apply the bias to the memory gate electrode MGE at the time of reading operation. Accordingly, the change of the polarization state of the ferroelectric film FEF at the time of reading operation can be prevented. As a result, the reliability of the semiconductor device SD can be increased.

(Second Feature)

The semiconductor device SD includes the control gate electrode CGE positioned between the memory gate electrode MGE and the drain region DR. At the time of reading operation, a voltage is applied to the control gate electrode CGE and the drain region DR. At this stage, the voltage $V_{CG}$ applied to the control gate electrode CGE is smaller than the voltage $V_D$ applied to the drain region DR (for example, $V_{CG}$: 1.3 V, $V_D$: 1.5V). As described above, the drain region DR to which the high voltage is applied is arranged to separate from the source region SR because of the control gate electrode CGE. This arrangement can suppress the undesirable electric current (punch-through current) from flowing in the source region SR and the drain region DR. The punch-through current is particularly remarkable when the length of the ferroelectric film FEF in the X direction is small. Therefore, the semiconductor device SD according to the present embodiment is particularly effective when the length of the memory gate electrode MGE in the X direction is equal to or smaller than 30 nm.

(Third Feature)

Figure 6:
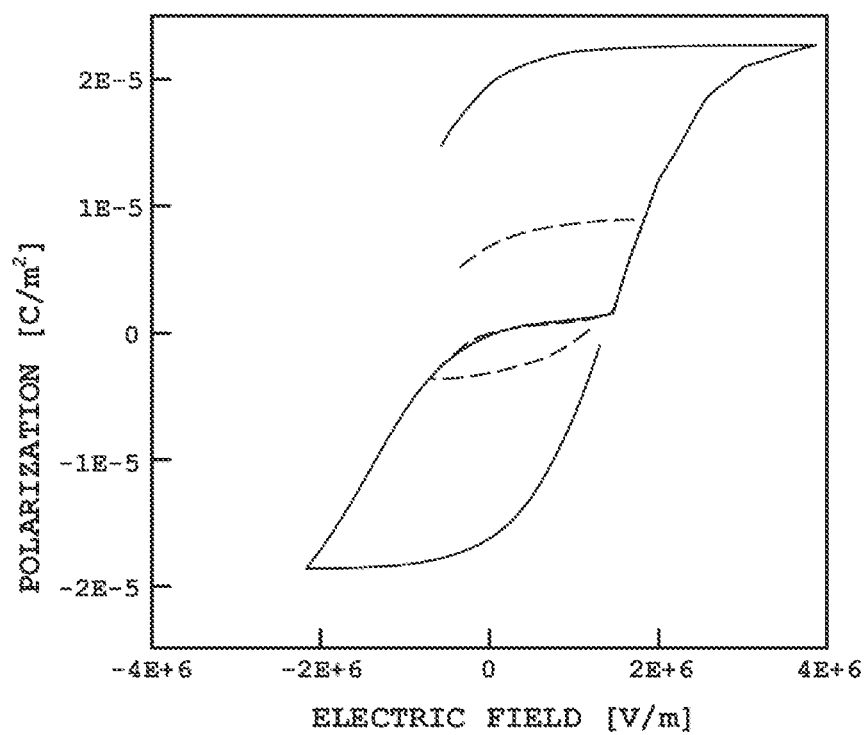
FIG. 6 is a graph showing simulation results of relation between a ratio of a length of a ferroelectric film with respect to a length of a first dielectric film and hysteresis characteristics of a ferroelectric memory cell.

FIG. 6 is a graph showing simulation results of a relation between the hysteresis characteristics of the ferroelectric memory cell and a ratio (Lf/Li) of the length Lf of the ferroelectric film with respect to the length Li of the first dielectric film IF1. In FIG. 6, a horizontal axis indicates the electric field [V/m] applied to the ferroelectric film FEF, and a vertical axis indicates a polarizability [C/m$^2$] of the ferroelectric film FEF. In FIG. 6, a broken line indicates a simulation result in a case of the ratio (Lf/Li) that is 1. A solid line indicates a simulation result in a case of the ratio (Lf/Li) that is 0.5.

As clearly seen in FIG. 6, in comparison with the case of the ratio that is 1, excellent hysteresis characteristics are observed in the case of the ratio that is 0.5. This is presumably because of the following reason. As shown in FIG. 4, the ferroelectric film FEF and the first dielectric film IF1 correspond to capacitors that are connected in series to each other. Therefore, the voltage that is applied between the memory gate electrode MGE and the well region WR of the semiconductor substrate SUB is distributed to the ferroelectric film FEF and the first dielectric film IF1. In this case, the voltage $V_{FEF}$ that is distributed to the ferroelectric film FEF is expressed by the following expression (1).

$$V_{FEF} = \frac{V_{MG}}{\frac{\epsilon_{FEF}}{\epsilon_{IL1}} \times \frac{d_{FEF}}{d_{IL1}} \times \frac{A_{FEF}}{A_{IL1}} + 1} \quad (1)$$

[In this expression, a term $\epsilon_{FEF}$ is a dielectric constant of the ferroelectric film FEF. A term $\epsilon_{IL1}$ is a dielectric constant of the first dielectric film IF1. A term $d_{FEF}$ is a thickness of the ferroelectric film FEF. A term $d_{IL1}$ is a thickness of the first dielectric film IF1. A term $A_{FEF}$ is a size (area) of the ferroelectric film FEF in a plan view. A term $A_{IL1}$ is a size (area) of the first dielectric film IF1.]

As clearly seen in the expression (1), when the $\epsilon_{FEF}$ the $\epsilon_{IL1}$, the $d_{FEF}$ and the $d_{IL1}$ are constant, the smaller a ratio $A_{FEF}/A_{IL1}$ is, the larger the voltage $V_{FEF}$ is. In other words, in the present embodiment, since the ratio (Lf/Li) of the length Lf of the ferroelectric film FEF in the Y direction with respect to the length Li of the first dielectric film IF1 in the Y direction is smaller than 1, it is found that the voltage that is applied to the ferroelectric film FEF is larger than that in the case of Lf/Li that is 1. In other words, the electric field is effectively applied to the ferroelectric film FEF, and the ferroelectric film FEF can be consequently strongly polarized. Since the Lf is smaller than the Li as described above, the characteristics of the semiconductor device SD can be enhanced.

[Method of Manufacturing Semiconductor Device]

Next, one example of a method of manufacturing the semiconductor device SD according to the present embodiment will be explained. Each of FIGS. 7 to 46 is a cross-sectional view showing one example of a step included in the method of manufacturing the semiconductor device SD. Odd-number views of FIGS. 7 to 46 correspond to the cross-sectional view taken along the line A-A of FIG. 1. Even-number views of FIGS. 7 to 46 correspond to the cross-sectional view taken along the line B-B of FIG. 1.

The method of manufacturing the semiconductor device SD according to the present embodiment includes: (1) a step of preparing the semiconductor wafer SW; (2) a step of forming the first dielectric film IF1; (3) a step of forming the conductive film CF; (4) a step of forming the amorphous film AMF; (5) a crystallization step; (6) a step of forming a penetrating portion PP; (7) a step of forming the second dielectric film IF2; (8) a step of forming a conductive film CFm for the memory gate electrode MGE; (9) a step of forming a hard mask HM; (10) a patterning step; (11) a step of forming the first sidewall dielectric film SWF1; (12) a step of forming the third dielectric film IF3; (13) a step of forming the control gate electrode CGE; (14) a step of forming the first impurity region IPR1; (15) a step of forming the second sidewall dielectric film SWF2; (16) a step of forming the second impurity region IPR2; (17) a step of forming the first dielectric layer IL1; (18) a CMP step; (19) a step of forming the second dielectric layer IL2; and (20) a step of forming the plug PLG.

(1) Preparation of Semiconductor Wafer SW

Figure 7:
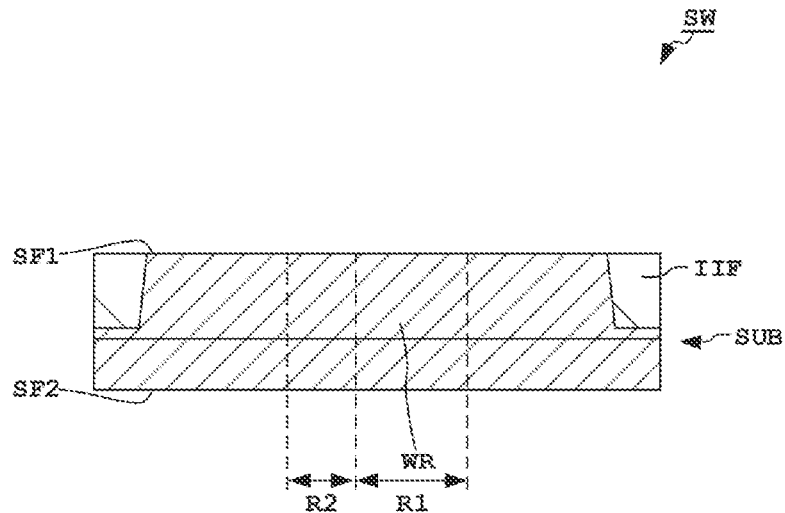
FIG. 7 is a cross-sectional view showing one example of a step included in a method of manufacturing a semiconductor device according to one embodiment.
Figure 8:
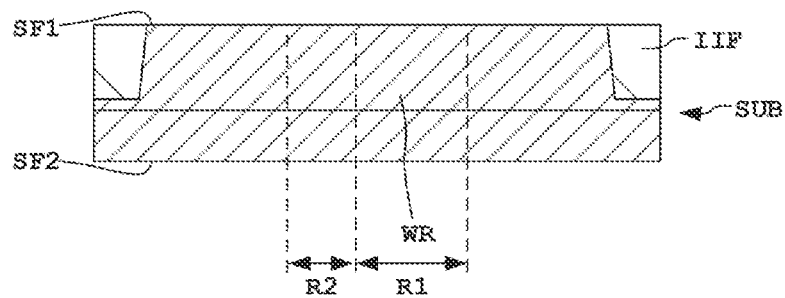
FIG. 8 is a cross-sectional view showing one example of a step included in the method of manufacturing the semiconductor device according to one embodiment.

First, as shown in FIGS. 7 and 8, the semiconductor wafer SW is prepared. The semiconductor wafer SW according to the present embodiment includes the semiconductor substrate SUB having the first surface SF1 on which the well region WR and the isolation dielectric film IIF are formed. The semiconductor wafer SW includes the first region R1 and the second region R2 positioned between regions where the source region SR and the drain region DR are designed to be formed.

The semiconductor wafer SW may be manufactured or purchased as a commercialized product. The semiconductor wafer SW is, for example, a silicon wafer. For example, the well region WR and the isolation dielectric film IIF may be formed on the silicon wafer that has been purchased as the commercialized product.

A method of forming the well region WR is not particularly limited. The well region WR is formed by, for example, an ion implantation method and activation annealing.

A method of forming the isolation dielectric film IIF is not particularly limited. The isolation dielectric film IIF may be formed by, for example, filling a concave portion in the semiconductor substrate SUB with a dielectric film. Alternatively, the isolation dielectric film IIF may be formed by, for example, a LOCOS method that oxidizes a part of the first surface SF1 of the semiconductor substrate SUB.

(2) Formation of First Dielectric Film IF1

Figure 9:
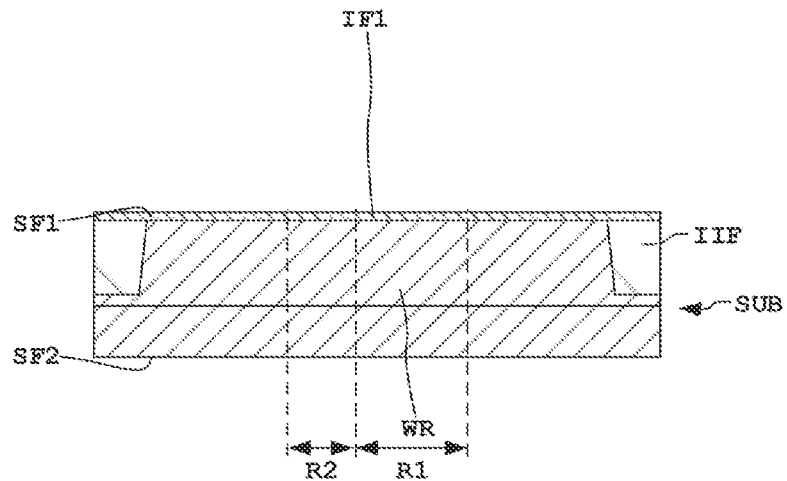
FIG. 9 is a cross-sectional view showing one example of a step included in the method of manufacturing the semiconductor device according to one embodiment.
Figure 10:
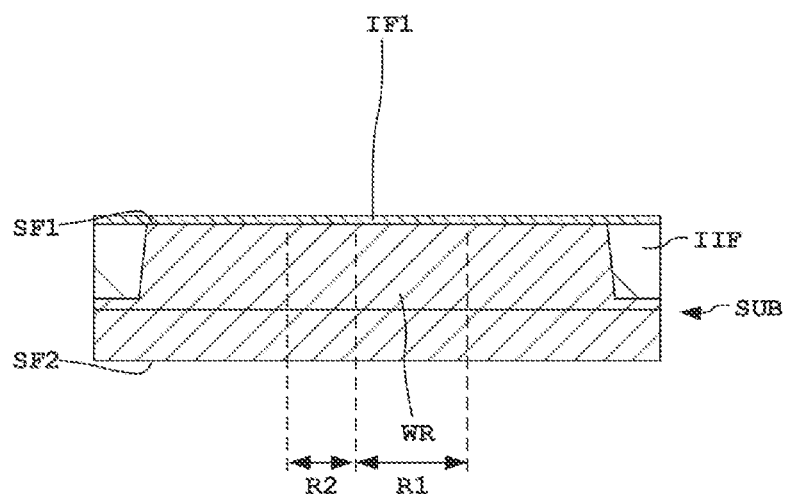
FIG. 10 is a cross-sectional view showing one example of a step included in the method of manufacturing the semiconductor device according to one embodiment.

Next, as shown in FIGS. 9 and 10, the first dielectric film IF1 is formed on the first surface SF1 of the semiconductor substrate SUB. A method of forming the first dielectric film IF1 is, for example, a thermal oxidation method or a CVD (Chemical Vapor Deposition) method. In the present step, the dielectric film IF is not patterned and is formed on the entire first surface SF1 of the semiconductor substrate SUB.

(3) Formation of Conductive Film CF

Figure 11:
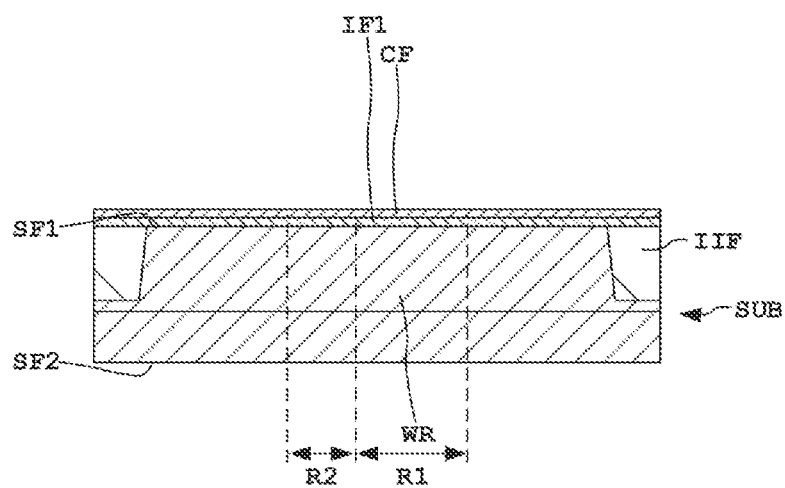
FIG. 11 is a cross-sectional view showing one example of a step included in the method of manufacturing the semiconductor device according to one embodiment.
Figure 12:
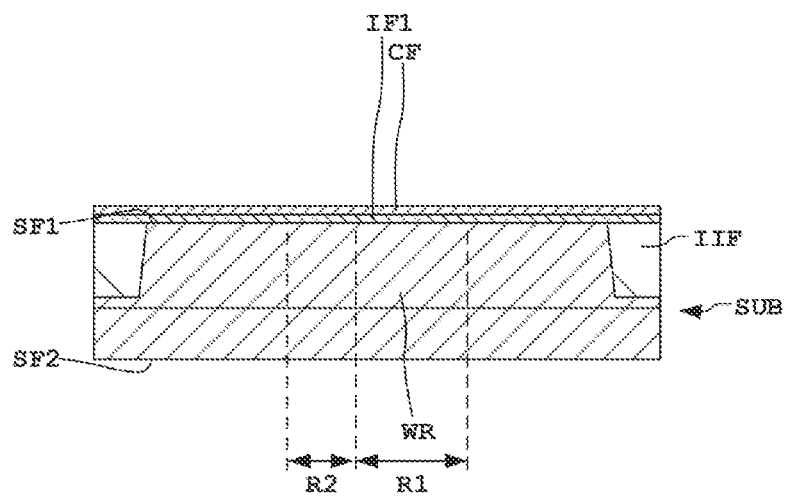
FIG. 12 is a cross-sectional view showing one example of a step included in the method of manufacturing the semiconductor device according to one embodiment.

Next, as shown in FIGS. 11 and 12, the conductive film CF is formed on the first dielectric film IF1. A method of forming the conductive film CF is, for example, a sputtering method. In the present step, the conductive film CF is not patterned and is formed on the entire first dielectric film IF1.

(4) Formation of Amorphous Film AMF

Figure 13:
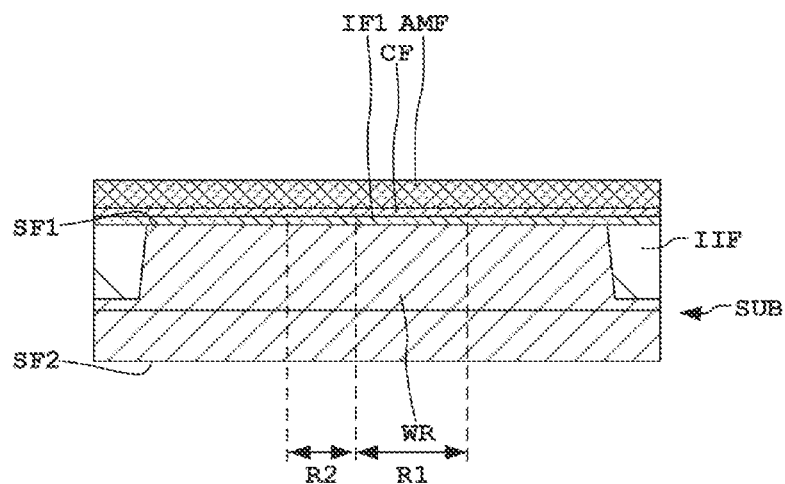
FIG. 13 is a cross-sectional view showing one example of a step included in the method of manufacturing the semiconductor device according to one embodiment.
Figure 14:
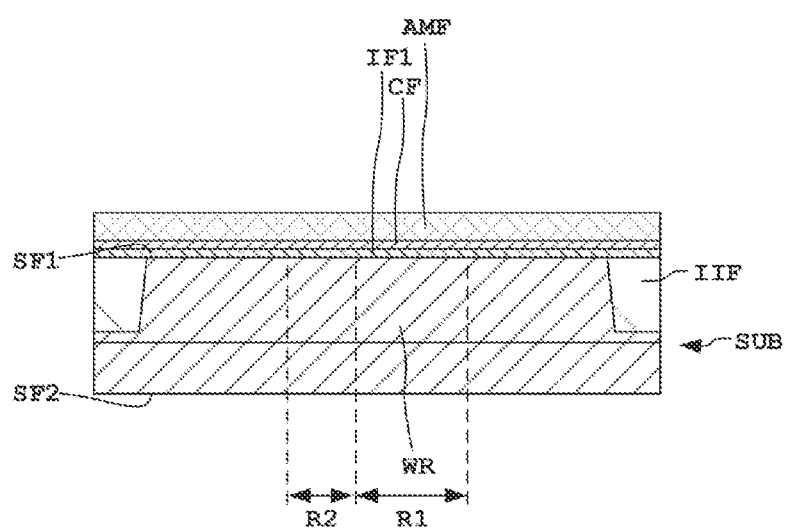
FIG. 14 is a cross-sectional view showing one example of a step included in the method of manufacturing the semiconductor device according to one embodiment.

Next, as shown in FIGS. 13 and 14, the amorphous film AMF is formed on the conductive film CF. The amorphous film AMF is the ferroelectric film FEF obtained before the crystallization. A method of forming the amorphous film AMF is, for example, an ALD (Atomic Layer Deposition) method.

In a case of addition of the crystallization accelerator into the amorphous film AFM, after formation of a first amorphous film, the crystallization accelerator may be formed on the first amorphous film by, for example, a sputtering method. In this case, after the formation of the crystallization accelerator, a second amorphous film is formed on the first amorphous film. After the formation of the amorphous film AMF, the crystallization accelerator may be formed inside the amorphous film AMF by, for example, an ion implantation method.

(5) Crystallization

Figure 15:
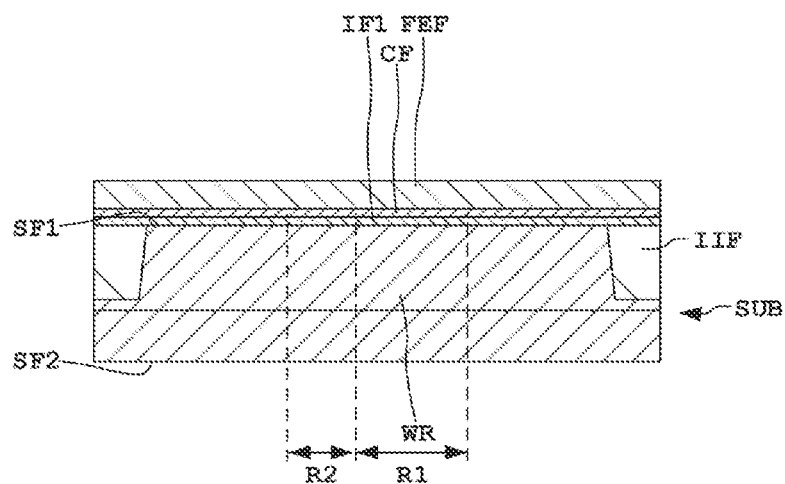
FIG. 15 is a cross-sectional view showing one example of a step included in the method of manufacturing the semiconductor device according to one embodiment.
Figure 16:
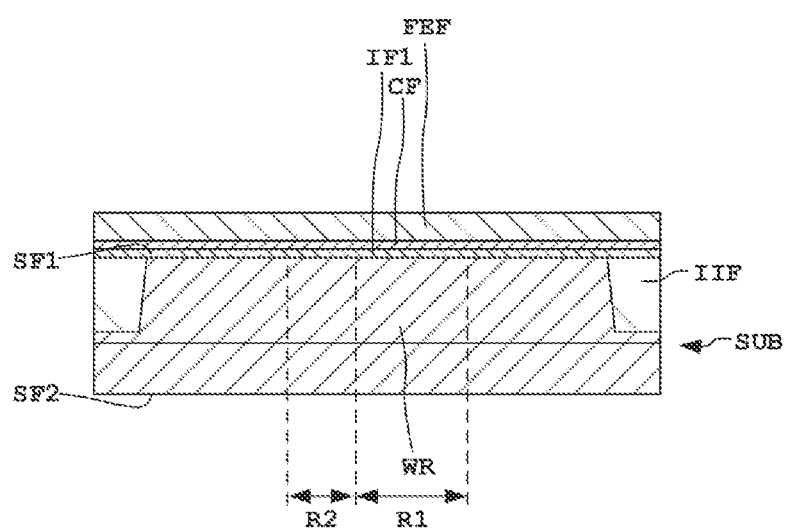
FIG. 16 is a cross-sectional view showing one example of a step included in the method of manufacturing the semiconductor device according to one embodiment.

Next, as shown in FIGS. 15 and 16, the amorphous film AFM is crystallized to form the ferroelectric film FEF. A method of the crystallization is, for example, a thermal process. A method of the thermal process is, for example, an RTA (Rapid Thermal Annealing) method. In this case, a heating temperature in the amorphous film AMF is, for example, equal to or higher than 600° C. and equal to or lower than 800° C. In this process, when the heating temperature is higher than 800° C. and equal to or lower than 1000° C., the crystal structure of the ferroelectric film FEF tends to be a monoclinic crystal system. As a result, the amorphous film AFM becomes not the ferroelectric film but the paraelectric film.

Another method of the thermal process is a thermal process using microwaves having a frequency that is equal to or higher than 1 GHz and equal to or lower than 10 GHz. In this case, the heating temperature in the amorphous film AMF is, for example, equal to or lower than 400° C.

(6) Formation of Penetrating Portion PP

Figure 17:
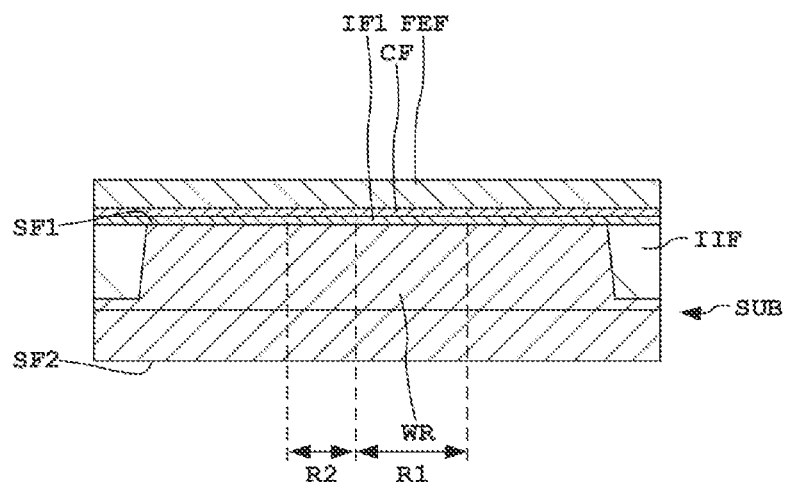
FIG. 17 is a cross-sectional view showing one example of a step included in the method of manufacturing the semiconductor device according to one embodiment.
Figure 18:
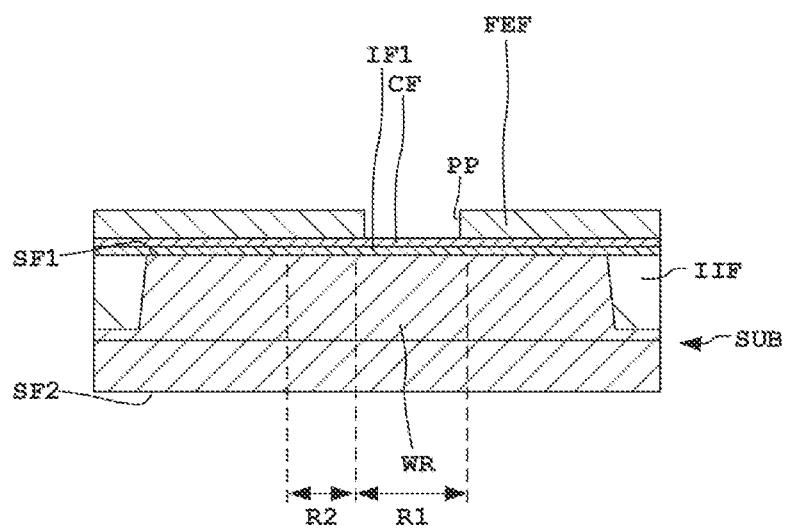
FIG. 18 is a cross-sectional view showing one example of a step included in the method of manufacturing the semiconductor device according to one embodiment.

Next, as shown in FIGS. 17 and 18, in the ferroelectric film FEF, a portion where the second dielectric film IF2 is designed to be formed is removed to form the penetrating portion PP. The penetrating portion PP penetrates the ferroelectric film FEF. At a bottom of the penetrating portion PP, an upper surface of the conductive film CF is exposed. The penetrating portion PP is formed by, for example, a photolithography method and an etching method. Although not particularly illustrated, a resist mask is formed on a region of the ferroelectric film FEF except for a region to be etched.

(7) Formation of Second Dielectric Film IF2

Figure 19:
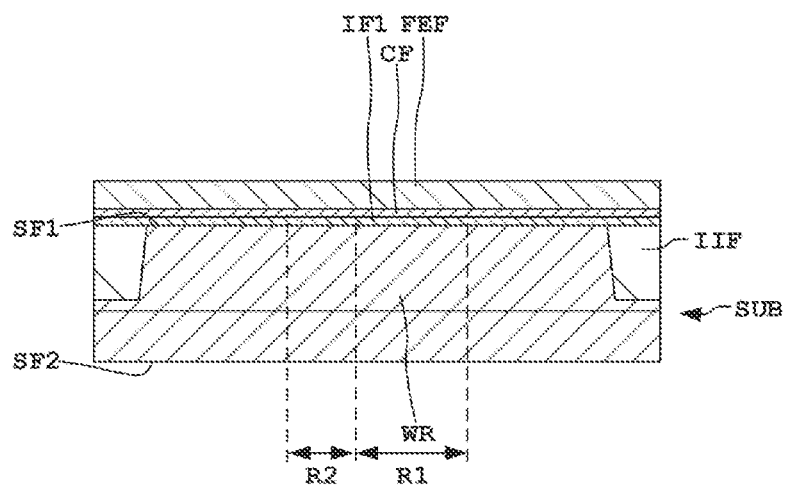
FIG. 19 is a cross-sectional view showing one example of a step included in the method of manufacturing the semiconductor device according to one embodiment.
Figure 20:
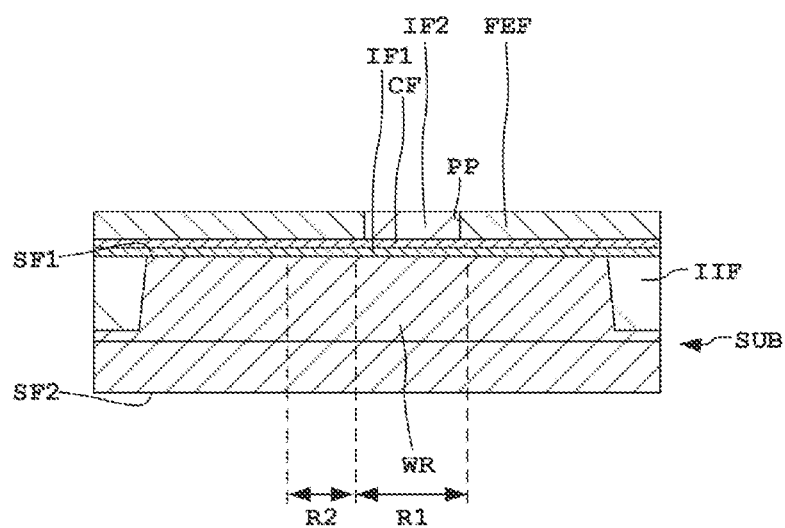
FIG. 20 is a cross-sectional view showing one example of a step included in the method of manufacturing the semiconductor device according to one embodiment.

Next, as shown in FIGS. 19 and 20, the second dielectric film IF2 is formed inside the penetrating portion PP. Specifically, the second dielectric film IF2 is formed on the ferroelectric film FEF so as to fill the penetrating portion PP, and then, a portion of the second dielectric film IF2, the portion being outside the penetrating portion PP, is removed. A method of forming the second dielectric film IF2 is, for example, a CVD method. The second dielectric film IF2 is removed by, for example, a photolithography method and an etching method.

(8) Formation of Conductive Film CFm for Memory Gate Electrode MGE

Figure 21:
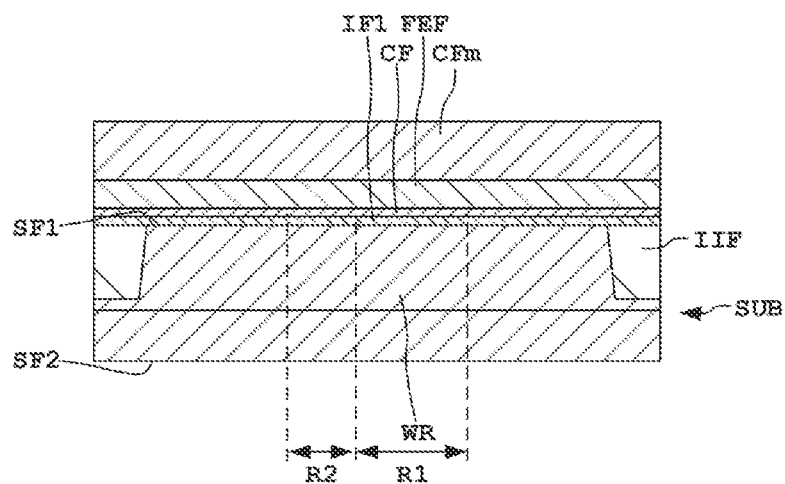
FIG. 21 is a cross-sectional view showing one example of a step included in the method of manufacturing the semiconductor device according to one embodiment.
Figure 22:
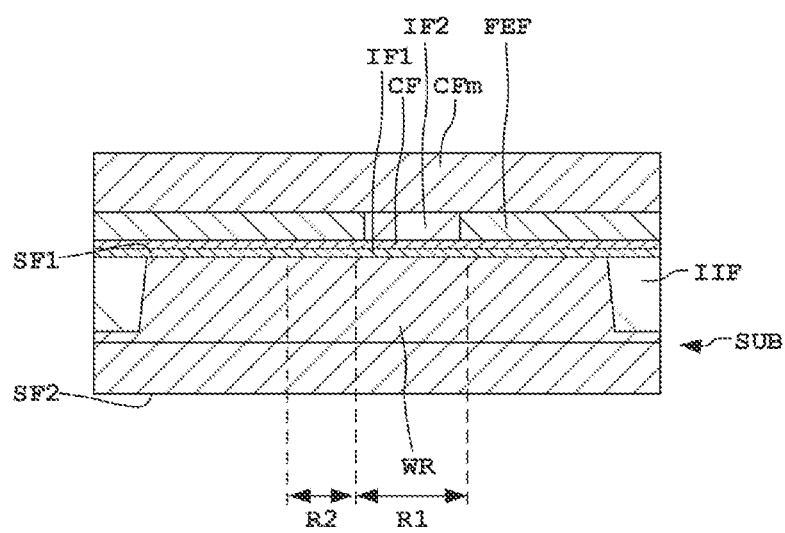
FIG. 22 is a cross-sectional view showing one example of a step included in the method of manufacturing the semiconductor device according to one embodiment.

Next, as shown in FIGS. 21 and 22, the conductive film CFm for the memory gate electrode MGE is formed on the ferroelectric film FEF and the second dielectric film IF2. A method of forming the conductive film CFm is, for example, a CVD method or a sputtering method. A material of the conductive film CFm is, for example, polycrystal silicon having a conductivity.

(9) Formation of Hard Mask HM

Figure 23:
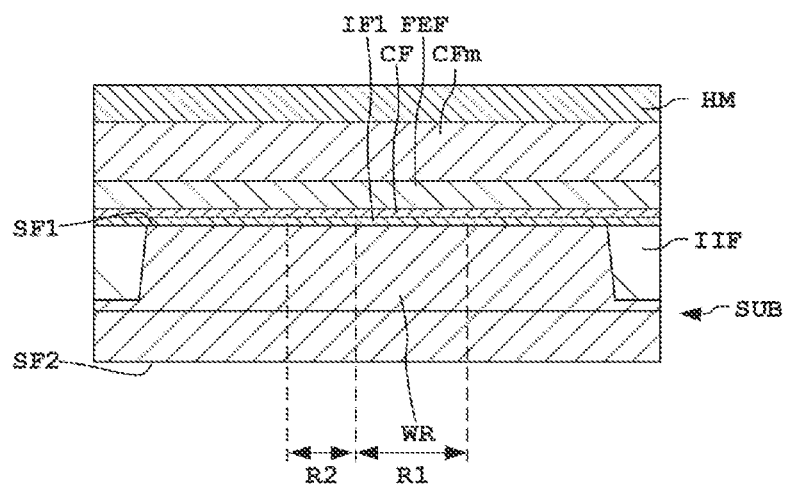
FIG. 23 is a cross-sectional view showing one example of a step included in the method of manufacturing the semiconductor device according to one embodiment.
Figure 24:
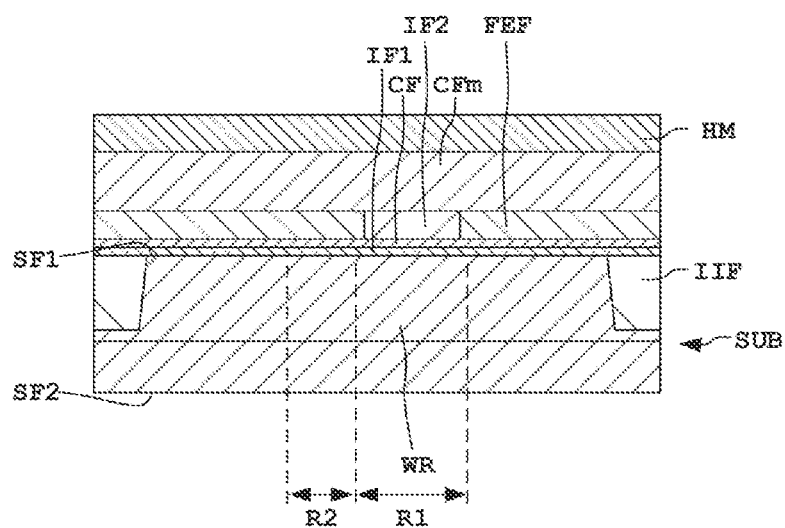
FIG. 24 is a cross-sectional view showing one example of a step included in the method of manufacturing the semiconductor device according to one embodiment.

Next, as shown in FIGS. 23 and 24, the hard mask HM is formed on the ferroelectric film FEF and the second dielectric film IF2. A method of forming the hard mask HM is, for example, a CVD method. A material of the hard mask HM is, for example, silicon nitride.

(10) Patterning

Figure 25:
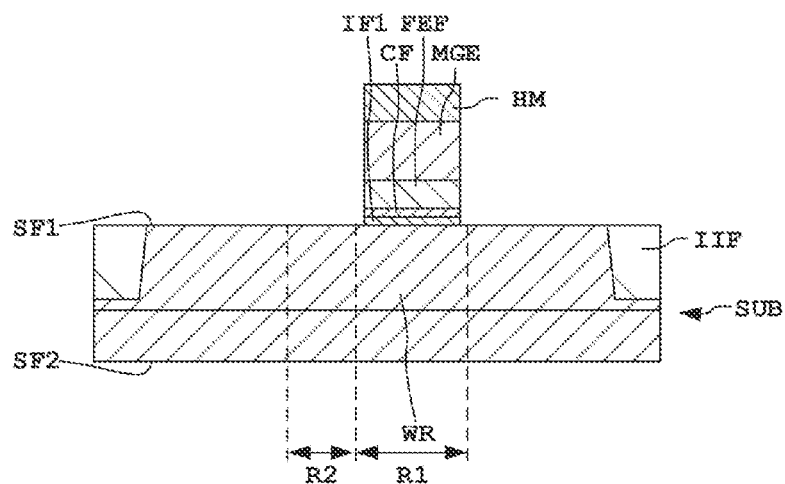
FIG. 25 is a cross-sectional view showing one example of a step included in the method of manufacturing the semiconductor device according to one embodiment.
Figure 26:
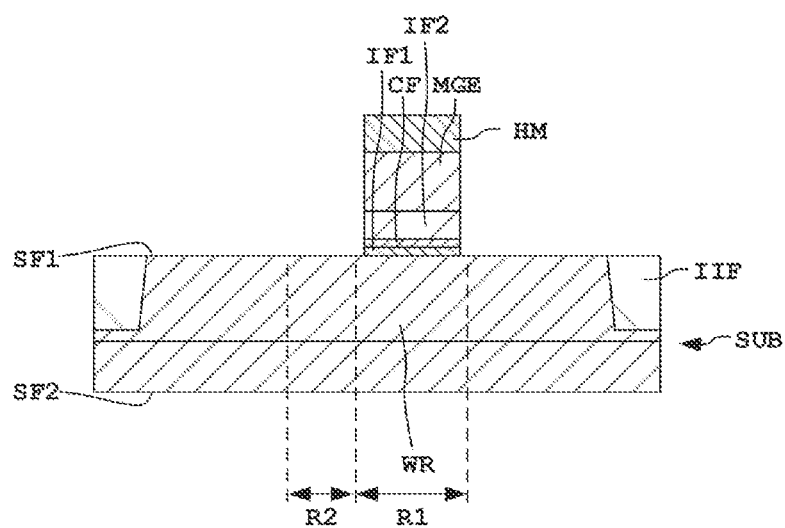
FIG. 26 is a cross-sectional view showing one example of a step included in the method of manufacturing the semiconductor device according to one embodiment.

Next, as shown in FIGS. 25 and 26, the hard mask HM, the conductive film CFm, the ferroelectric film FEF, the conductive film CF and the first dielectric film IF1 are patterned so as to provide a desirable pattern. Specifically, each of the components is patterned so that a portion on the first region R1 of the semiconductor substrate SUB remains. By the patterning of the conductive film CFm, the memory gate electrode MGE is formed. The patterning is performed by, for example, a photolithography method and an etching method.

(11) Formation of First Sidewall Dielectric Film SWF1

Figure 27:
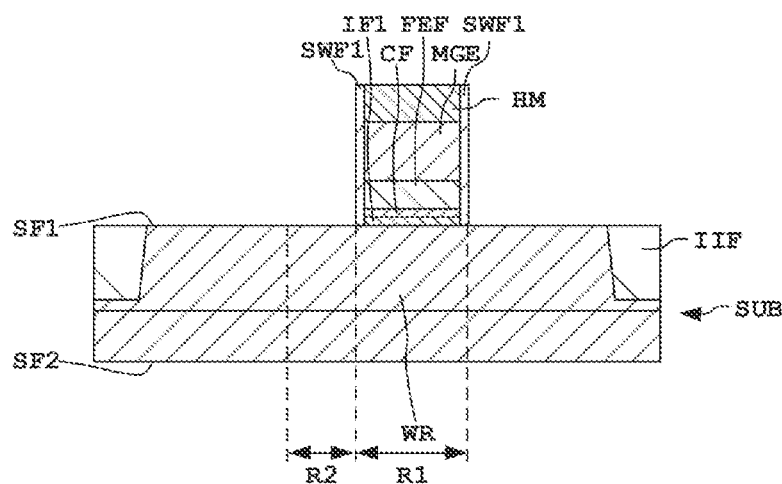
FIG. 27 is a cross-sectional view showing one example of a step included in the method of manufacturing the semiconductor device according to one embodiment.
Figure 28:
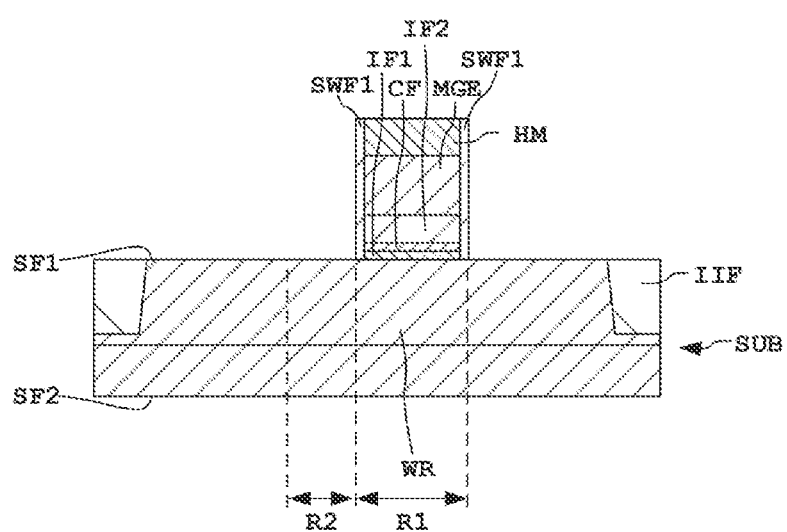
FIG. 28 is a cross-sectional view showing one example of a step included in the method of manufacturing the semiconductor device according to one embodiment.

Next, as shown in FIGS. 27 and 28, the pair of first sidewall dielectric films SWF1 are formed on the third structural body made of the first dielectric film IF1, the conductive film CF, the ferroelectric film FEF, the second dielectric film IF2, the memory gate electrode MGE and the hard mask HM. Specifically, the dielectric film is formed on the first surface SF1 of the semiconductor substrate SUB so as to cover the third structural body, and then, a part of the dielectric film is removed so that the dielectric film remains on a sidewall of the third structural body. A method of forming the dielectric film is, for example, a CVD method. The part of the dielectric film is removed by, for example, a photolithography method and an etching method.

(12) Formation of Third Dielectric Film IF3

Figure 29:
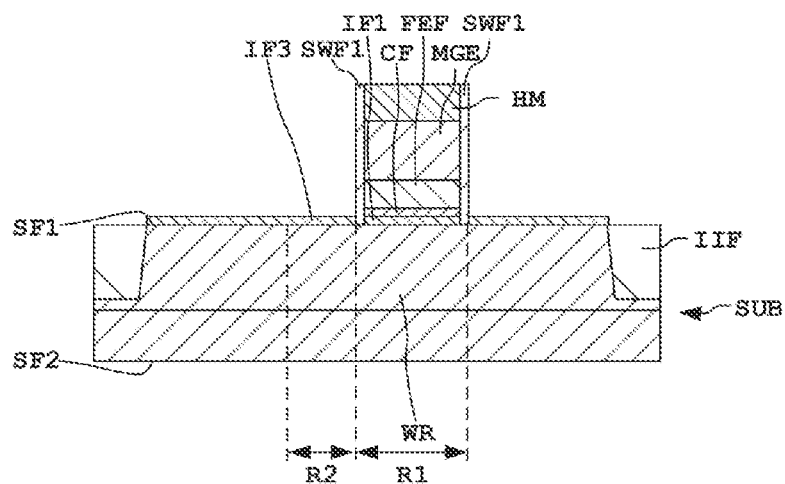
FIG. 29 is a cross-sectional view showing one example of a step included in the method of manufacturing the semiconductor device according to one embodiment.
Figure 30:
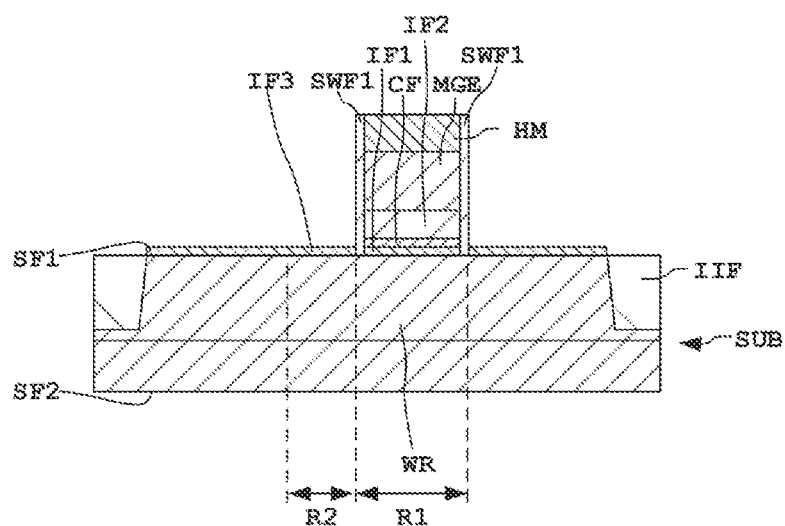
FIG. 30 is a cross-sectional view showing one example of a step included in the method of manufacturing the semiconductor device according to one embodiment.

Next, as shown in FIGS. 29 and 30, the third dielectric film IF3 is formed on the first surface SF1 of the semiconductor substrate SUB. A method of forming the third dielectric film IF3 is, for example, a thermal oxidation method or a CVD (chemical vapor deposition) method. In the present step, the third dielectric film IF3 is not patterned and formed on a portion of the first surface SF1 of the semiconductor substrate SUB except for the first region R1.

(13) Formation of Control Gate Electrode CGE

Figure 31:
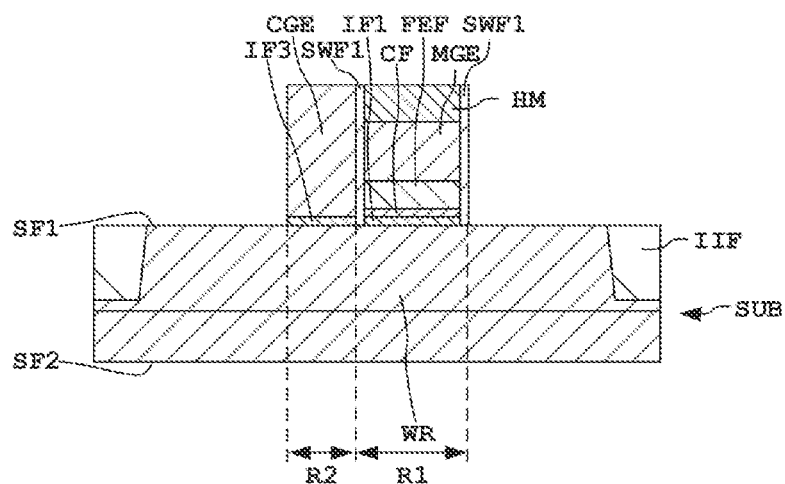
FIG. 31 is a cross-sectional view showing one example of a step included in the method of manufacturing the semiconductor device according to one embodiment.
Figure 32:
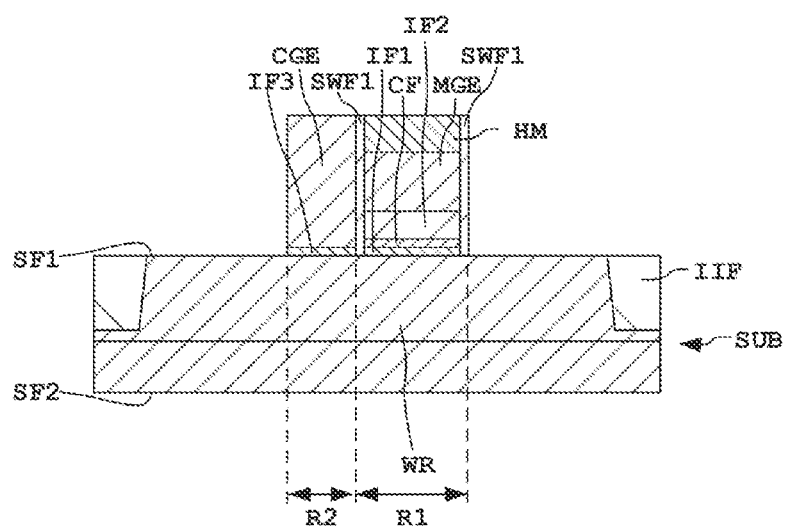
FIG. 32 is a cross-sectional view showing one example of a step included in the method of manufacturing the semiconductor device according to one embodiment.

Next, as shown in FIGS. 31 and 32, the control gate electrode CGE is formed on the third dielectric film IF3. Specifically, the conductive film for the control gate electrode CGE is formed on the third dielectric film IF3, and then, the patterning is performed so as to provide a desirable pattern. More specifically, the conductive film for the control gate electrode CGE is patterned so that a portion on the second region R2 of the semiconductor substrate SUB remains. In this manner, the control gate electrode CGE is formed on the third dielectric film IF3 so as to be adjacent to the memory gate electrode MGE via the first sidewall dielectric film SWF1. In the present step, note that the third dielectric film IF3 is also patterned so that a portion on the second region R2 of the semiconductor substrate SUB remains.

(14) Formation of First Impurity Region IPR1

Figure 33:
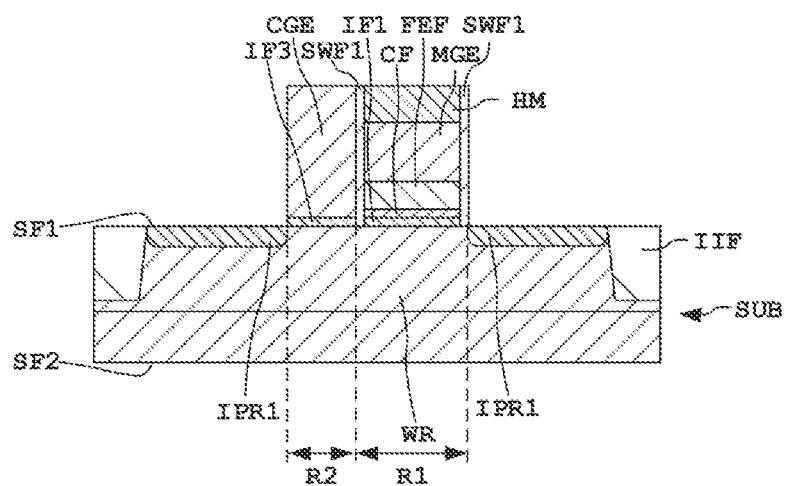
FIG. 33 is a cross-sectional view showing one example of a step included in the method of manufacturing the semiconductor device according to one embodiment.
Figure 34:
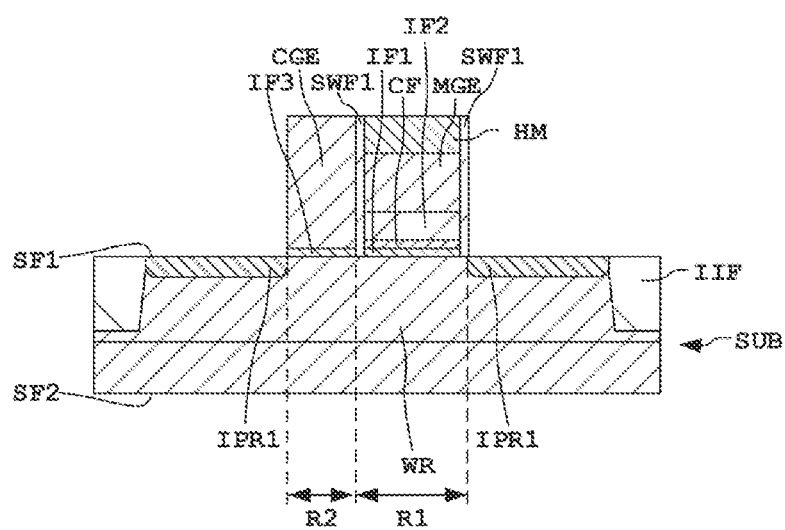
FIG. 34 is a cross-sectional view showing one example of a step included in the method of manufacturing the semiconductor device according to one embodiment.

Next, as shown in FIGS. 33 and 34, the first impurity region IPR1 is formed in the first surface SF1 of the semiconductor substrate SUB. The first impurity region IPR1 is formed in a region next to the memory gate electrode MGE and a region next to the control gate electrode CGE in a plan view. The first impurity region IPR1 is formed by, for example, an ion implantation method and an activation annealing. Although not particularly illustrated, note that a resist mask is formed on a region except for a region where the ion implantation is designed to be performed by the ion implantation method.

(15) Formation of Second Sidewall Dielectric Film SWF2

Figure 35:
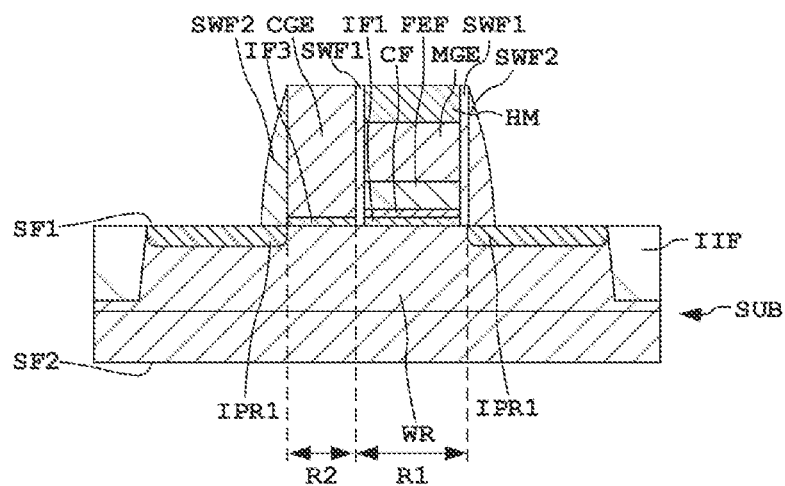
FIG. 35 is a cross-sectional view showing one example of a step included in the method of manufacturing the semiconductor device according to one embodiment.
Figure 36:
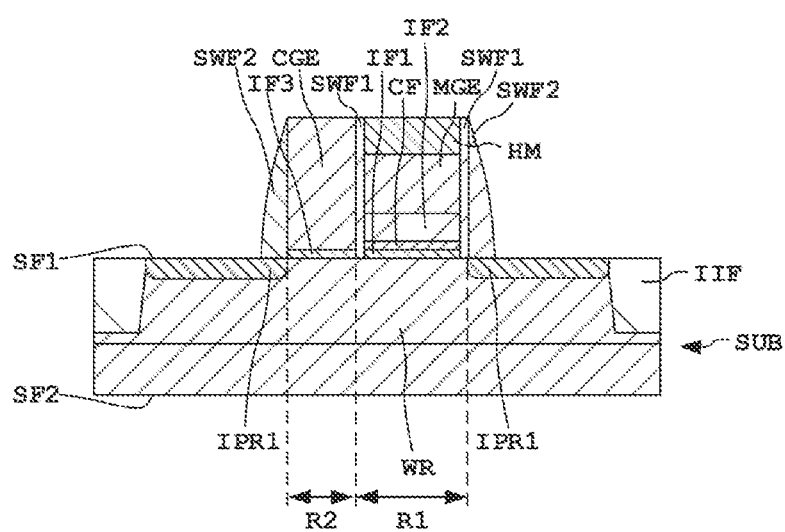
FIG. 36 is a cross-sectional view showing one example of a step included in the method of manufacturing the semiconductor device according to one embodiment.

Next, as shown in FIGS. 35 and 36, the pair of second sidewall dielectric films SWF2 are formed on the first surface SF1 of the semiconductor substrate SUB so as to sandwich the third structural body and the fourth structural body made of the first sidewall dielectric film SWF1, the third dielectric film IF3 and the control gate electrode CGE. The dielectric film is formed on the first surface SF1 of the semiconductor substrate SUB so as to cover the fourth structural body, and then, a part of the dielectric film is removed so that a portion of the dielectric film on a sidewall of the fourth structural body remains. The part of the dielectric film is removed by, for example, a photolithography method and an etching method.

(16) Formation of Second Impurity Region IPR2

Figure 37:
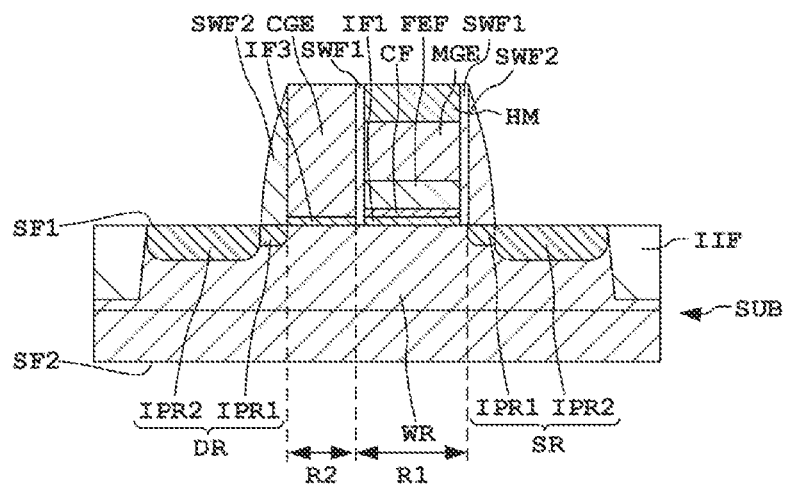
FIG. 37 is a cross-sectional view showing one example of a step included in the method of manufacturing the semiconductor device according to one embodiment.
Figure 38:
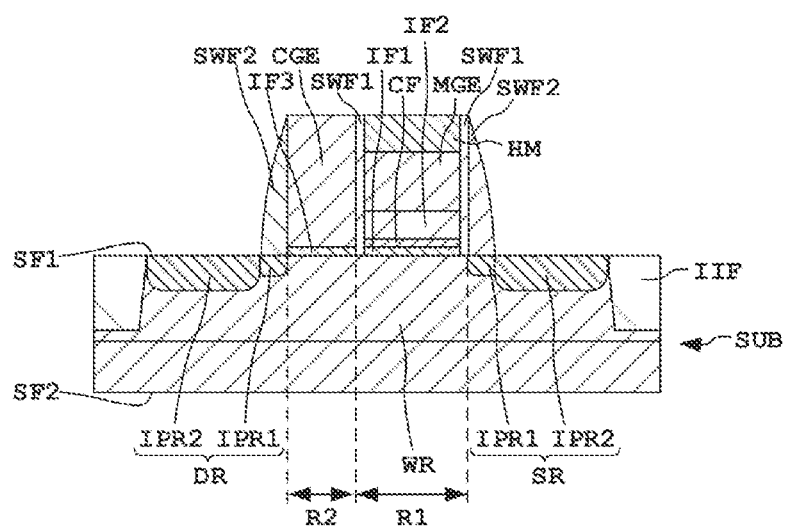
FIG. 38 is a cross-sectional view showing one example of a step included in the method of manufacturing the semiconductor device according to one embodiment.

Next, as shown in FIGS. 37 and 38, the second impurity region IPR2 is formed in the first surface SF1 of the semiconductor substrate SUB. In the semiconductor substrate SUB, the second impurity region IPR2 is formed between the second sidewall dielectric film SWF2 and the isolation dielectric film IIF. In this manner, the source region SR and the drain region DR are formed.

(17) Formation of First Dielectric Layer IL1

Figure 39:
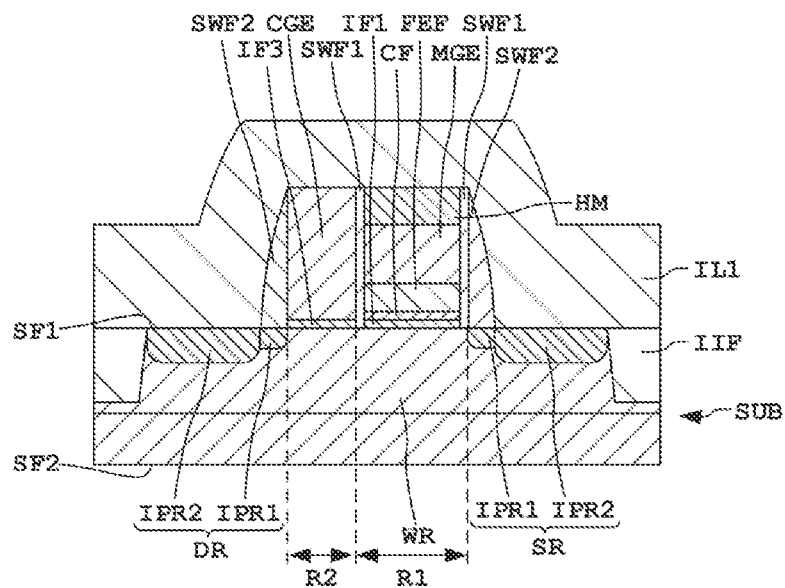
FIG. 39 is a cross-sectional view showing one example of a step included in the method of manufacturing the semiconductor device according to one embodiment.
Figure 40:
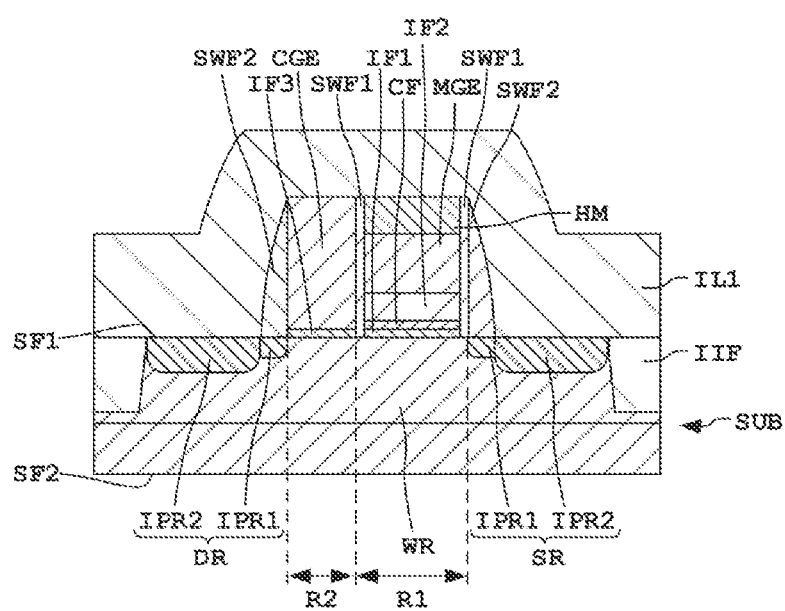
FIG. 40 is a cross-sectional view showing one example of a step included in the method of manufacturing the semiconductor device according to one embodiment.

Next, as shown in FIGS. 39 and 40, the first dielectric layer IL1 is formed on the first surface SF1 of the semiconductor substrate SUB so as to cover the gate structural body made of the fourth structural body and the second sidewall dielectric film SWF2. A method of forming the first dielectric layer IL1 is, for example, a CVD method.

(18) CMP

Figure 41:
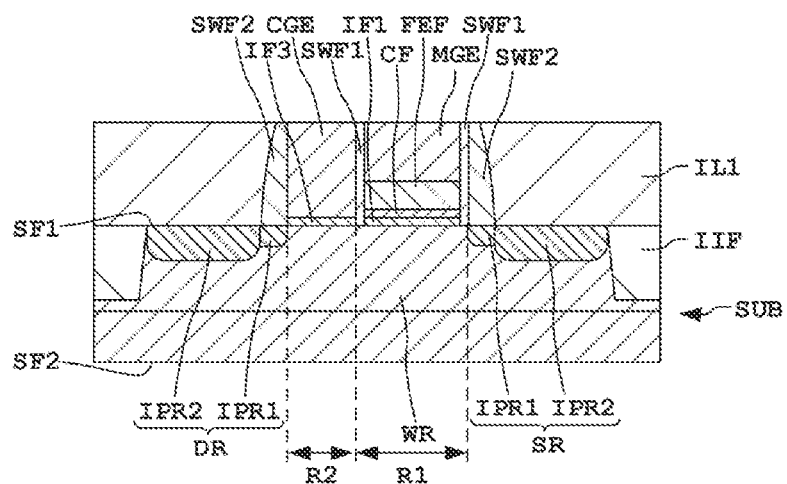
FIG. 41 is a cross-sectional view showing one example of a step included in the method of manufacturing the semiconductor device according to one embodiment.
Figure 42:
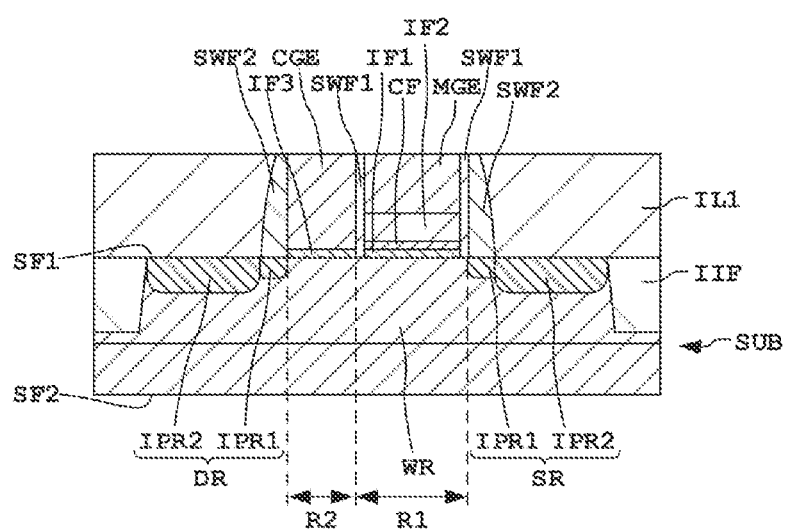
FIG. 42 is a cross-sectional view showing one example of a step included in the method of manufacturing the semiconductor device according to one embodiment.

Next, as shown in FIGS. 41 and 42, apart of the gate structural body and a part of the first dielectric layer IL1 are polished. In this manner, a height of the gate structural body is adjusted. A method of polishing the gate structural body and the first dielectric layer IL1 is a CMP method.

(19) Formation of Second Dielectric Layer IL2

Figure 43:
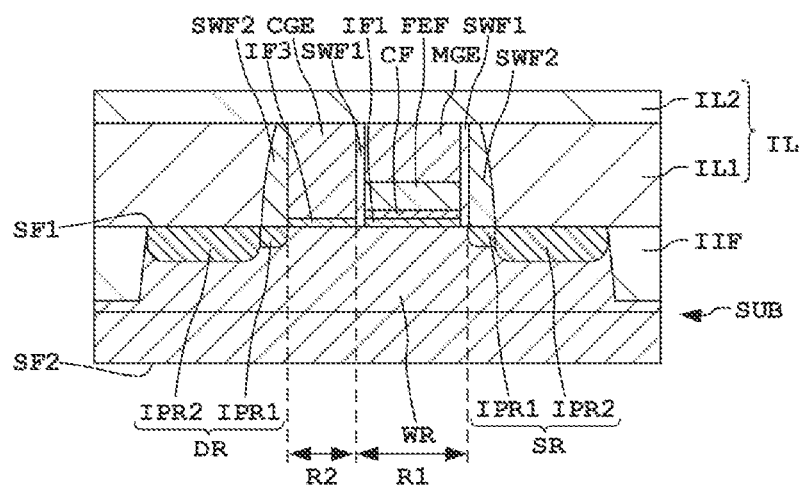
FIG. 43 is a cross-sectional view showing one example of a step included in the method of manufacturing the semiconductor device according to one embodiment.
Figure 44:
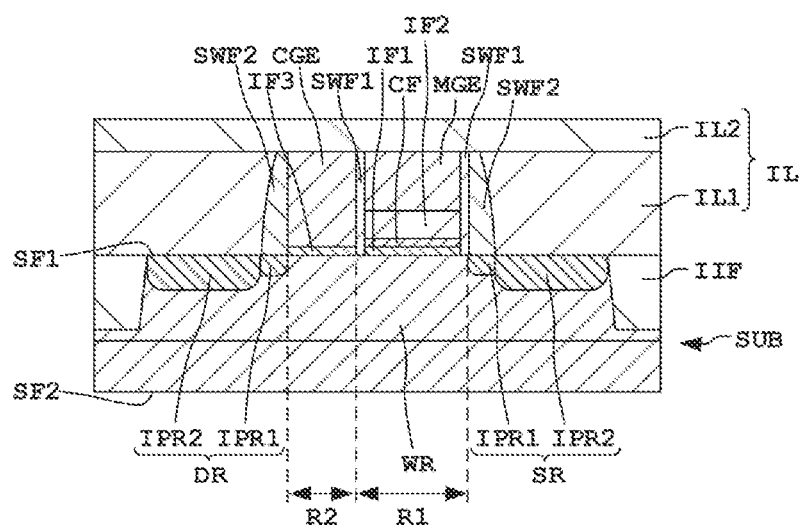
FIG. 44 is a cross-sectional view showing one example of a step included in the method of manufacturing the semiconductor device according to one embodiment.

Next, as shown in FIGS. 43 and 44, the second dielectric layer IL2 is formed on the memory gate electrode MGE, the control gate electrode CGE and the first dielectric layer IL1. In this manner, the dielectric layer IL is formed. A method of forming the second dielectric layer IL2 is, for example, a CVD method.

(20) Formation of Plug PLG

Figure 45:
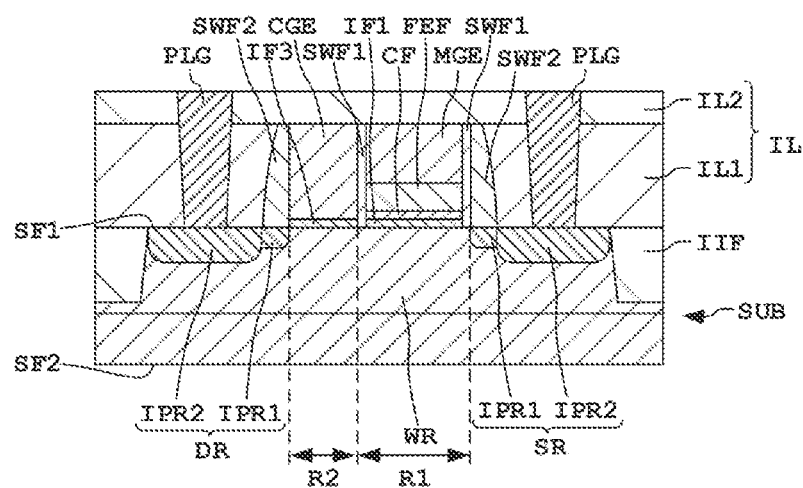
FIG. 45 is a cross-sectional view showing one example of a step included in the method of manufacturing the semiconductor device according to one embodiment.
Figure 46:
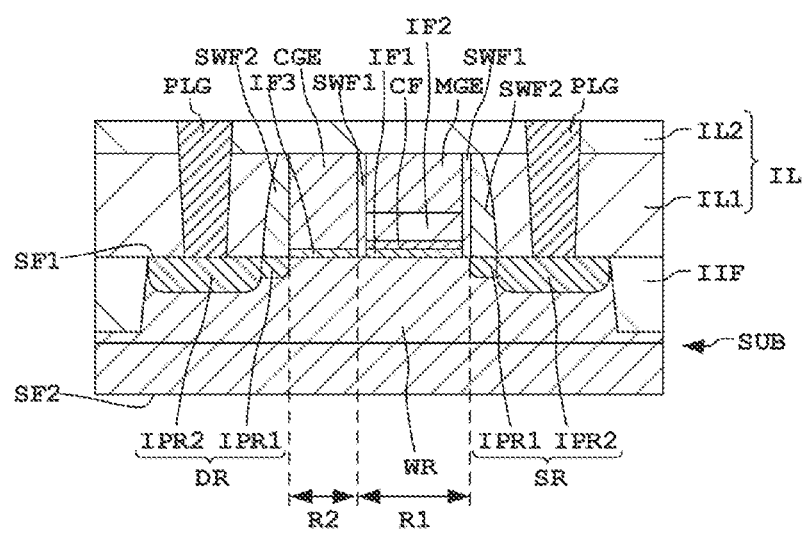
FIG. 46 is a cross-sectional view showing one example of a step included in the method of manufacturing the semiconductor device according to one embodiment.

Next, as shown in FIGS. 45 and 46, the plug PLG is formed inside the dielectric layer IL. The plug PLG penetrates the first dielectric layer IL1 and the second dielectric layer IL2. The plug PLG is formed by the formation of the penetration hole inside the dielectric layer IL, and then, the filling of the penetration hole with the conductive material.

Next, although not particularly illustrated, the wiring layer is formed on the dielectric layer IL. In the end, by dicing of the resultant structural body in the above-described steps, the plurality of diced semiconductor devices SD are obtained.

By the above-described manufacturing method, the semiconductor device SD according to the present embodiment is manufactured. In the present embodiment, after the step of forming the ferroelectric film FEF (the crystallization step) and the step of forming the penetrating portion PP, the control gate electrode CGE is formed. If the ferroelectric film FEF and the penetrating portion PP are formed after the formation of the control gate electrode CGE, it is necessary to pattern the ferroelectric film FEF while the ferroelectric film FEF is formed so as to cover the upper surface and the side surface of the control gate electrode CGE. Particularly, it is difficult to remove a portion of the ferroelectric film FEF on the side surface of the control gate electrode CGE by the dry etching method. Therefore, the ferroelectric film FEF cannot be appropriately patterned. On the other hand, the present embodiment can form the penetrating portion PP while the ferroelectric film FEF extends along the first surface of the semiconductor substrate SUB. In this manner, the ferroelectric film FEF can be appropriately patterned.

(Effects)

The semiconductor device SD according to the present embodiment includes the memory gate electrode MGE and the control gate electrode CGE. Therefore, it is unnecessary to apply the bias to the memory gate electrode MGE at the time of the reading operation of the semiconductor device SD (see the first feature). Since the semiconductor device SD includes the control gate electrode CGE, the drain region DR to which the high voltage is applied can be formed to separate from the source region SR. In this manner, the punch-through current at the time of the reading operation can be reduced (seethe second feature). As these results, the reliability of the semiconductor device SD can be increased.

In the present embodiment, the length Lf of the ferroelectric film FEF is smaller than the length Li of the first dielectric film IF1 in the Y direction. In this manner, the electric field can be effectively applied to the ferroelectric film FEF. Therefore, the ferroelectric film FEF can be strongly polarized (see the third feature). As a result, the characteristics of the semiconductor device SD can be enhanced.

First Modification Example

Figure 47:
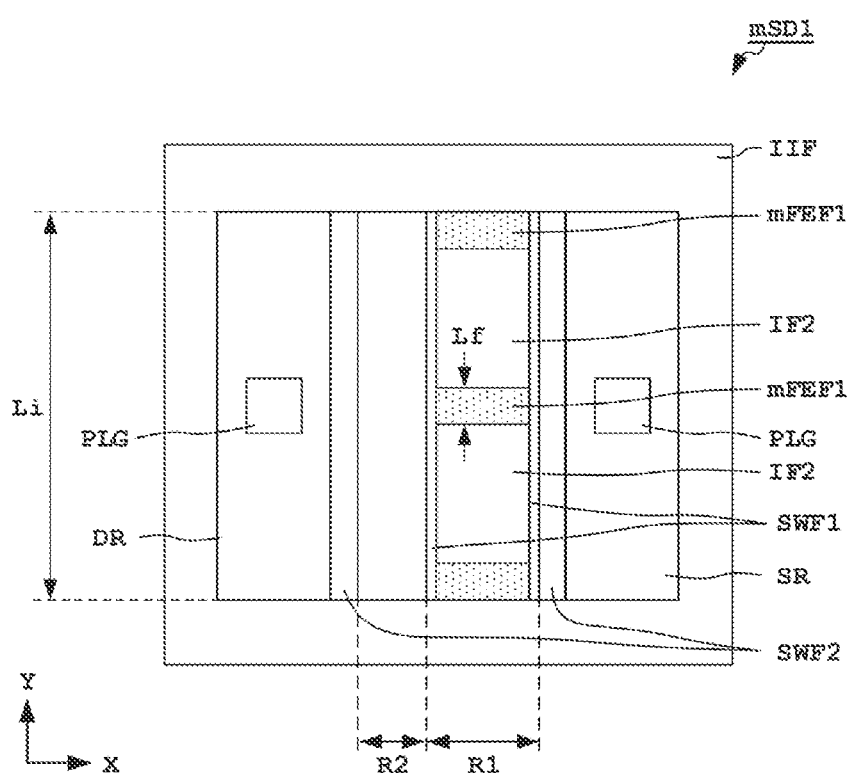
FIG. 47 is a plan view showing one example of a configuration of a principal part of a semiconductor device according to a first modification example of one embodiment.

FIG. 47 is a plan view showing one example of a configuration of a principal part of a semiconductor device mSD1 according to a first modification example of the present embodiment.

The semiconductor device mSD1 according to the first modification example includes a plurality of ferroelectric films mFEF1. In the first modification example, the number of the ferroelectric films mFEF1 is three. Two ferroelectric films mFEF1 of the three ferroelectric films mFEF1 are formed so as to be in contact with the isolation dielectric film IIF in a plan view. Two ferroelectric films mFEF1 of the three ferroelectric films mFEF1 separate from the isolation dielectric film IIF in a plan view. Since the ferroelectric films mFEF1 are formed so as to be in contact with the isolation dielectric film IIF, the two ferroelectric films mFEF1 can be formed in a region having the smallest influence of the ferroelectric film mFEF1 that is formed at a center in the Y direction. Therefore, in the semiconductor device mSD1, the effect of the polarization of the ferroelectric films mFEF1 can more evenly affect the ferroelectric memory cell. As a result, the characteristics of the semiconductor device mSD1 can be enhanced.

Second Modification Example

Figure 48:
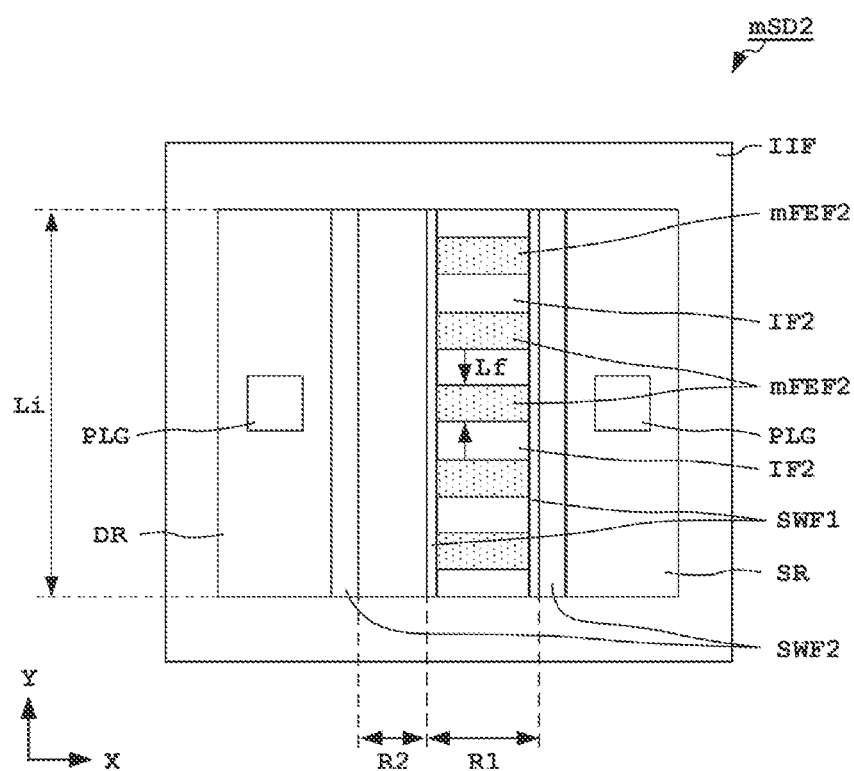
FIG. 48 is a plan view showing one example of a configuration of a principal part of a semiconductor device according to a second modification example of one embodiment.

FIG. 48 is a plan view showing one example of a configuration of a principal part of a semiconductor device mSD2 according to a second modification example of the present embodiment.

The semiconductor device mSD2 according to the second modification example includes a plurality of ferroelectric films mFEF2. The plurality of ferroelectric films mFEF2 are arranged to be equidistant from one another in the Y direction. In this manner, the effect of the polarization of the ferroelectric films mFEF2 can more evenly affect the ferroelectric memory cell. As a result, the characteristics of the semiconductor device mSD2 can be enhanced.

Note that the two ferroelectric films mFEF2 that are adjacent to each other separate from each other via the second dielectric film IF2. The memory gate electrode MGE is formed in contact with the plurality of ferroelectric films mFEF2 and the plurality of second dielectric films IF2. In the manner, the potential is applied to each of the plurality of ferroelectric films mFEF2 via one memory gate electrode MGE.

Third Modification Example

Figure 49:
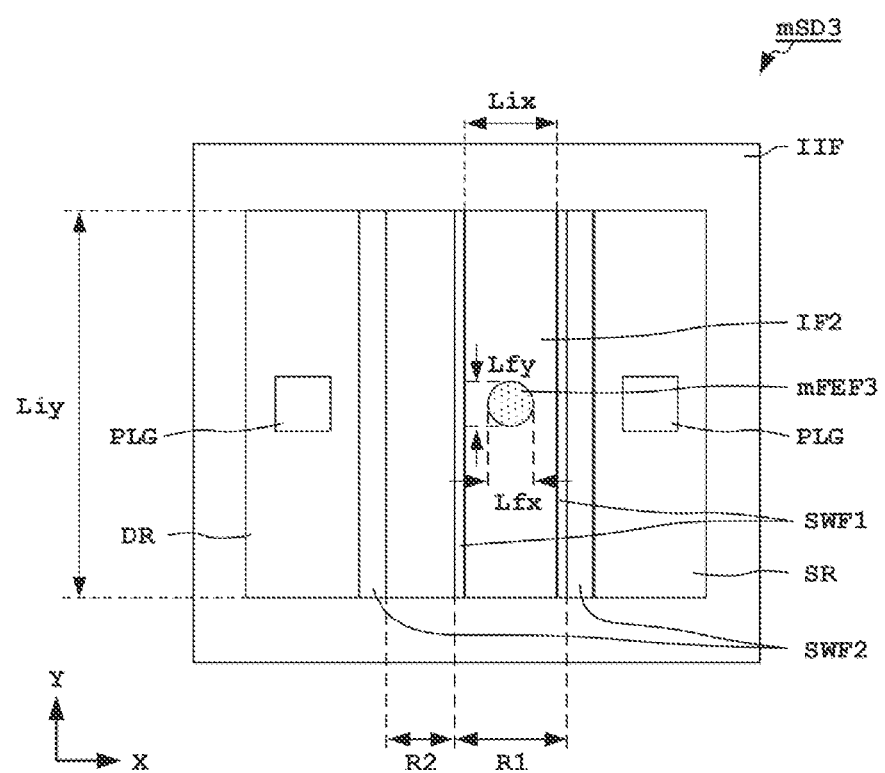
FIG. 49 is a plan view showing one example of a configuration of a principal part of a semiconductor device according to a third modification example of one embodiment.

FIG. 49 is a plan view showing one example of a configuration of a principal part of a semiconductor device mSD3 according to a third modification example of the present embodiment.

The semiconductor device mSD3 according to the third modification example includes a ferroelectric film mFEF3. The ferroelectric film mFEF3 includes portions having lengths that are smaller than the lengths of the first dielectric film IF1 in the X direction and the Y direction. A length Lfx of the ferroelectric film mFEF3 in the X direction is smaller than a length Lix of the first dielectric film IF1 in the X direction. A length Lfy of the ferroelectric film mFEF3 in the Y direction is smaller than a length Liy of the first dielectric film IF1 in the Y direction. A shape of the ferroelectric film mFEF3 is not particularly limited. The shape of the ferroelectric film mFEF3 may be circular or rectangular in a plan view. In the third modification example, the shape of the ferroelectric film mFEF3 is circular in a plan view.

In the third modification example, in not only the X direction but also the Y direction, the length of the ferroelectric film mFEF3 is smaller than the length of the first dielectric film IF1. In the manner, the voltage can be more effectively applied to the ferroelectric film mFEF3. As a result, the characteristics of the semiconductor device mSD3 can be enhanced.

Fourth Modification Example

Figure 50:
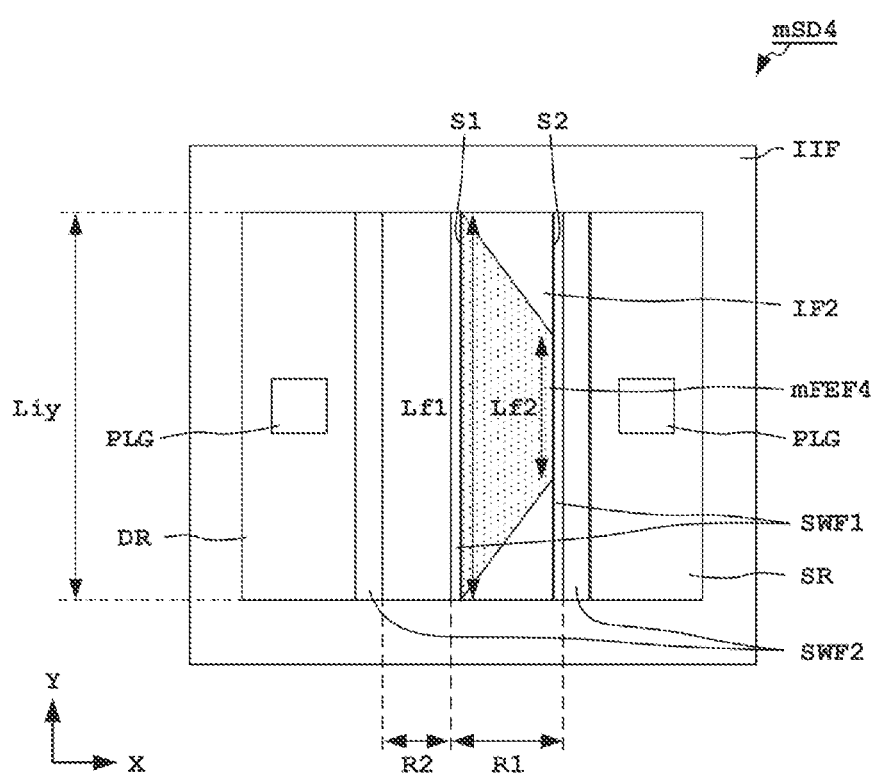
FIG. 50 is a plan view showing one example of a configuration of a principal part of a semiconductor device according to a fourth modification example of one embodiment.

FIG. 50 is a plan view showing one example of a configuration of a principal part of a semiconductor device mSD4 according to a fourth modification example of the present embodiment.

The semiconductor device mSD4 according to the fourth modification example includes a ferroelectric film mFEF4. The ferroelectric film mFEF4 has a first side S1 and a second side S2 facing the first side S1 in a plan view. The first side S1 is positioned to be closer to the drain region DR and extends along the control gate electrode CGE. The second side S2 is positioned to be closer to the source region SR and faces the first side S1. In the fourth modification example, in the Y direction, a length Lf1 of the first side S1 is larger than a length Lf2 of the second side S2. In the manner, at the time of the reading operation, while the ferroelectric film FEF is difficult to be affected by the voltage applied to the control gate electrode CGE, the electric field can be effectively applied to the ferroelectric film FEF. As a result, the reliability of the semiconductor device mSD4 can be increased.

Fifth Modification Example

Figure 51:
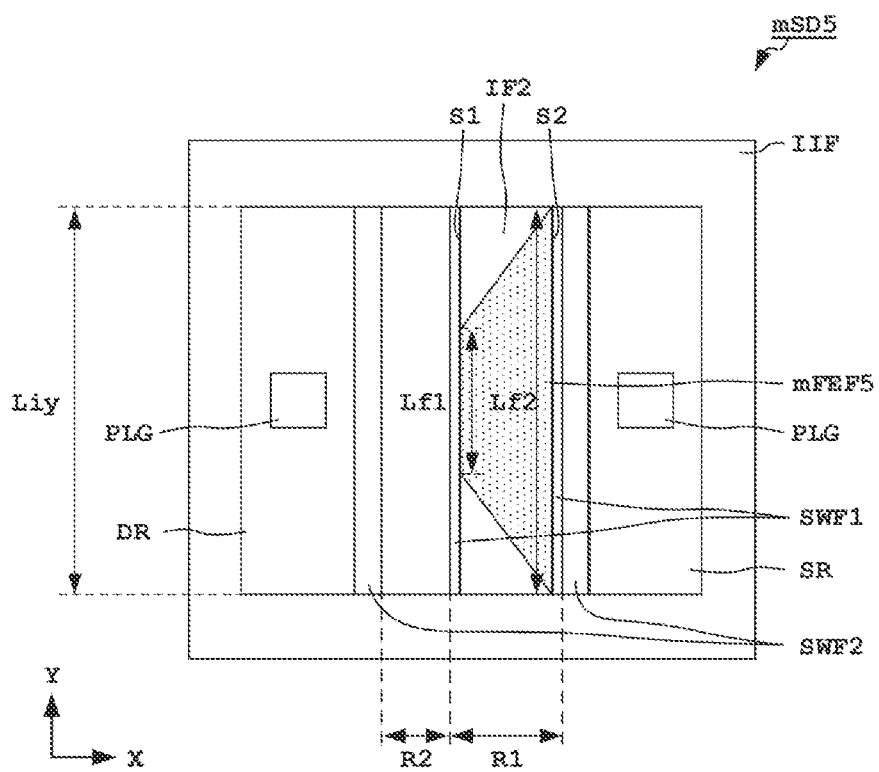
FIG. 51 is a plan view showing one example of a configuration of a principal part of a semiconductor device according to a fifth modification example of one embodiment.

FIG. 51 is a plan view showing one example of a configuration of a principal part of a semiconductor device mSD5 according to a fifth modification example of the present embodiment.

The semiconductor device mSD5 according to the fifth modification example includes a ferroelectric film mFEF5. The ferroelectric film mFEF5 has a first side S1 and a second side S2. In the fifth modification example, in the Y direction, a length Lf1 of the first side S1 is smaller than a length Lf2 of the second side S2. In the manner, at the time of the reading operation, a region of the ferroelectric film FEF affected by the voltage applied to the control gate electrode CGE can be made smaller than that of the semiconductor device mSD4 according to the fourth modification example. As a result, the reliability of the semiconductor device mSD5 can be increased.

Sixth Modification Example

Figure 52:
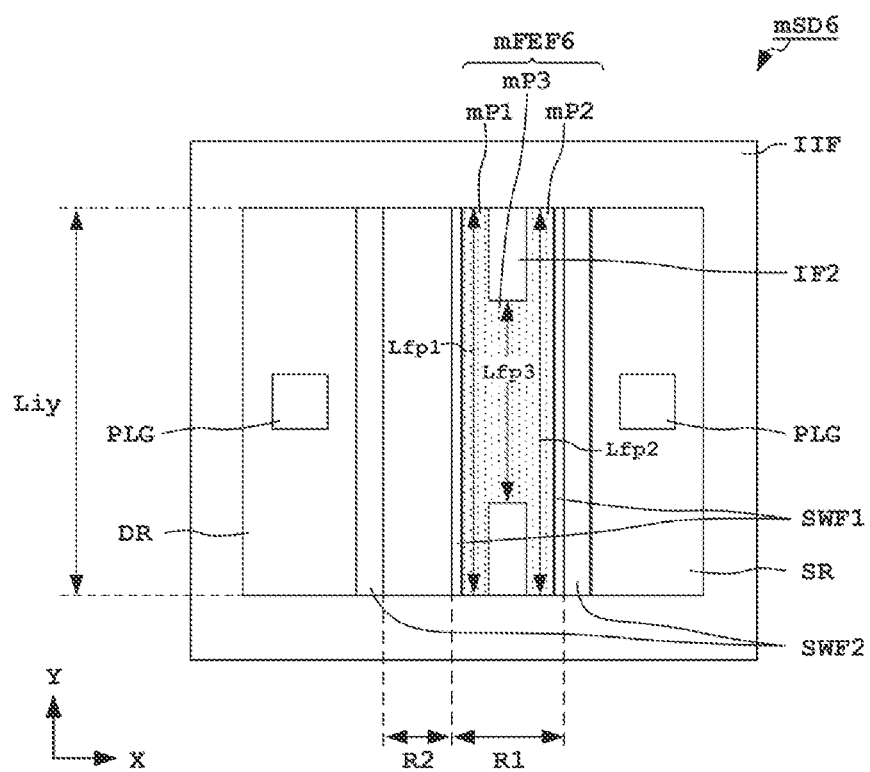
FIG. 52 is a plan view showing one example of a configuration of a principal part of a semiconductor device according to a sixth modification example of one embodiment.

FIG. 52 is a plan view showing one example of a configuration of a principal part of a semiconductor device mSD6 according to a sixth modification example of the present embodiment.

The semiconductor device mSD6 according to the sixth modification example includes a ferroelectric film mFEF6. The ferroelectric film mFEF6 has a first portion mP1, a second portion mP2 and a third portion mP3. The first portion mP1 is positioned to be closer to the drain region DR and has a first length Lfp1 in the Y direction. The second portion mP2 is positioned to be closer to the source region SR and has a second length Lfp2 in the Y direction. The third portion mP3 is positioned to be between the first portion mP1 and the second portion mP2 in the X direction and has a third length Lfp3 in the Y direction. The third length Lfp3 is smaller than the first length Lfp1 and the second length Lfp2. In the manner, at the time of the reading operation, while the ferroelectric film FEF is difficult to be affected by the voltage in the periphery such as the control gate electrode CGE and a plug (not illustrated) formed on the source region SR, the electric field can be effectively applied to the ferroelectric film FEF.

Note that the first length Lfp1 and the second length Lfp2 may be the same as or different from each other. In the sixth modification example, the first length Lfp1 and the second length Lfp2 are the same as each other.

Seventh Modification Example

Figure 53:
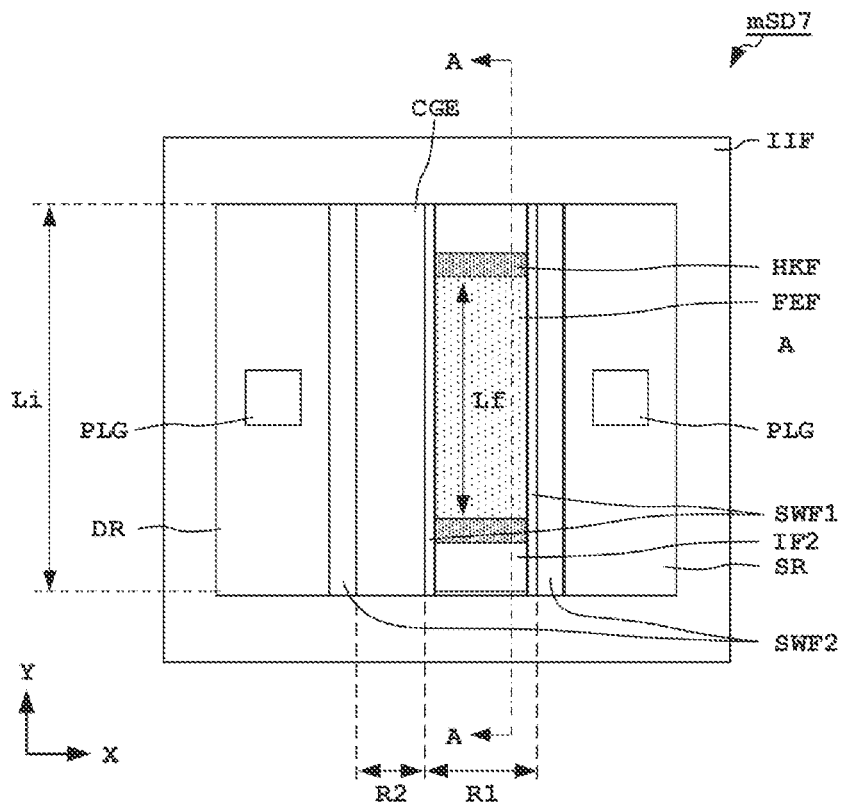
FIG. 53 is a plan view showing one example of a configuration of a principal part of a semiconductor device according to a seventh modification example of one embodiment.
Figure 54:
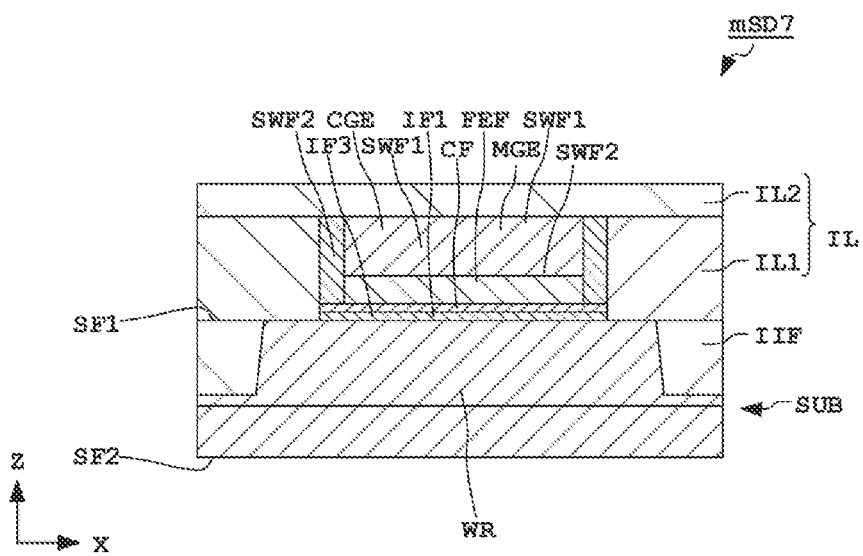
FIG. 54 is a cross-sectional view showing one example of the configuration of the principal part of the semiconductor device according to the seventh modification example of one embodiment.

FIG. 53 is a plan view showing one example of a configuration of a principal part of a semiconductor device mSD7 according to a seventh modification example of the present embodiment. FIG. 54 is a cross-sectional view showing one example of a configuration of a principal part of the semiconductor device mSD7. FIG. 54 is a cross-sectional view taken along a line A-A of FIG. 53.

The semiconductor device mSD7 according to the seventh modification example further includes a high dielectric film HKF. A material of the high dielectric film HKF is, for example, HfSiO. A dielectric constant of the high dielectric film HKF is larger than a dielectric constant of the first dielectric layer IL1. The high dielectric film HKF is formed to extend along the X direction in a plan view. The high dielectric film HKF is formed on the conductive film CF so as to be in contact with a side surface of the ferroelectric film FEF and a side surface of the memory gate electrode MGE. The high dielectric film HKF has a function of enhancing a fringe electric field between the conductive film CF and the side surface of the memory gate electrode MGE. As a result, the polarization characteristics of the ferroelectric film FEF can be enhanced. In this manner, the characteristics of the semiconductor device mSD7 can be more enhanced.

Note that the present invention is not limited to the foregoing embodiments, and various modifications can be made within the scope of the present invention.

Further, even when specific numerical value examples are mentioned, the numerical values may exceed the specific numerical values or smaller than the specific numerical values unless otherwise logically limited to the number. Also, components are described to mean "B containing A as a main component" or others, and not to mean exclusion of aspects containing other components.

What is claimed is:

1. A semiconductor device comprising:
   a semiconductor substrate including a source region and a drain region formed on its main surface, a first region between the source region and the drain region to be closer to the source region, and a second region therebetween to be closer to the drain region;
   a first dielectric film formed on the first region of the semiconductor substrate;
   a conductive film formed on the first dielectric film;
   at least one ferroelectric film formed on one part of the conductive film;
   a second dielectric film formed on the other part of the conductive film;
   a memory gate electrode formed on the ferroelectric film;
   a third dielectric film formed on the second region of the semiconductor substrate; and
   a control gate electrode formed on the third dielectric film.

2. The semiconductor device according to claim 1,
   wherein the at least one ferroelectric film has a portion having a length that is smaller than a length of the first dielectric film in a second direction being orthogonal to a first direction heading from either one of the source region and the drain region to the other and extending along the main surface of the semiconductor substrate.

3. The semiconductor device according to claim 2, further comprising:
   an isolation dielectric film formed on the main surface of the semiconductor substrate and surrounding the source region, the drain region, the first region and the second region in a plan view,
   wherein the at least one ferroelectric film separates from the isolation dielectric film.

4. The semiconductor device according to claim 3,
   wherein the at least one ferroelectric film includes:
   a first ferroelectric film being in contact with the isolation dielectric film in a plan view; and
   a second ferroelectric film separating from the isolation dielectric film in a plan view.

5. The semiconductor device according to claim 2,
   wherein the at least one ferroelectric film is a plurality of ferroelectric films, and
   wherein the ferroelectric films are arranged to be equidistant from one another in the second direction.

6. The semiconductor device according to claim 2,
   wherein, in the first direction, the at least one ferroelectric film has a portion having a length that is smaller than a length of the first dielectric film.

7. The semiconductor device according to claim 2,
   wherein the at least one ferroelectric film has:
   a first side positioned to be closer to the drain region and extending along the control gate electrode; and
   a second side positioned to be closer to the source region and facing the first side, and
   wherein a length of the first side is smaller than a length of the second side.

8. The semiconductor device according to claim 2,
   wherein the at least one ferroelectric film has:
   a first side positioned to be closer to the drain region and extending along the control gate electrode; and
   a second side positioned to be closer to the source region and facing the first side, and
   wherein a length of the second side is smaller than a length of the first side.

9. The semiconductor device according to claim 2,
   wherein the at least one ferroelectric film has:
   a first portion positioned to be closer to the drain region and having a first length in the second direction;
   a second portion positioned to be closer to the source region and having a second length in the second direction; and
   a third portion positioned between the first portion and the second portion in the first direction and having a third length in the second direction,
   wherein the third length is smaller than each of the first length and the second length.

10. The semiconductor device according to claim 2, further comprising:
    a high dielectric film formed on the conductive film so as Lobe in contact with a side surface of the at least one ferroelectric film and a side surface of the memory gate electrode; and
    a dielectric layer formed on the main surface of the semiconductor substrate so as to cover the high dielectric film,
    wherein a dielectric constant of the high dielectric film is larger than a dielectric constant of the dielectric layer.

11. A method of manufacturing a semiconductor device comprising the steps of:
    forming a first dielectric film on a main surface of a semiconductor substrate;

forming a first conductive film on the first dielectric film;
forming a ferroelectric film on the first conductive film;
forming a second conductive film for a memory gate electrode on the ferroelectric film;
patterning the second conductive film to form the memory gate electrode and patterning the ferroelectric film, the first conductive film and the first dielectric film;
forming a sidewall dielectric film on a sidewall of a structural body made of the memory gate electrode, the ferroelectric film, the first conductive film and the first dielectric film;
forming a second dielectric film on the main surface of the semiconductor substrate;
forming a control gate electrode on the second dielectric film so as to be adjacent to the memory gate electrode via the sidewall dielectric film; and
forming a source region in a region adjacent to the memory gate electrode and forming a drain region in a region adjacent to the control gate electrode in the semiconductor substrate in a plan view.

12. The method according to claim 11, further comprising the steps of:
forming a penetrating portion in the ferroelectric film before the step of forming the second conductive film; and
forming a second dielectric film so as to fill the penetrating portion before the step of forming the second conductive film,
wherein the ferroelectric film has a portion having a length that is smaller than a length of the first dielectric film in a second direction being orthogonal to a first direction heading from either one of the source region and the drain region to the other and extending along the main surface of the semiconductor substrate.

* * * * *